United States Patent
Tsai et al.

(10) Patent No.: US 10,630,116 B2
(45) Date of Patent: *Apr. 21, 2020

(54) INTRUDING METAL DETECTION METHOD FOR INDUCTION TYPE POWER SUPPLY SYSTEM AND RELATED SUPPLYING-END MODULE

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,526

(22) Filed: Sep. 12, 2018

(65) Prior Publication Data

US 2019/0013701 A1 Jan. 10, 2019

Related U.S. Application Data

(63) Continuation-in-part of application No. 15/005,014, filed on Jan. 25, 2016, now Pat. No. 10,114,396, and
(Continued)

(30) Foreign Application Priority Data

Feb. 1, 2011 (TW) .............................. 100103836 A
May 3, 2013 (TW) .............................. 102115983 A
(Continued)

(51) Int. Cl.
*G05F 1/66* (2006.01)
*H02J 50/60* (2016.01)
(Continued)

(52) U.S. Cl.
CPC ................ *H02J 50/60* (2016.02); *G01V 3/10* (2013.01); *G01V 3/105* (2013.01); *G05F 1/66* (2013.01);
(Continued)

(58) Field of Classification Search
CPC .......... H02J 50/60; H02J 50/12; G01V 3/105; G05F 1/66
(Continued)

(56) References Cited

U.S. PATENT DOCUMENTS

| 3,573,817 A | 4/1971 | Akers |
| 9,143,002 B2 | 9/2015 | Yeo |

(Continued)

FOREIGN PATENT DOCUMENTS

| CN | 101399464 A | 4/2009 |
| CN | 101834473 A | 9/2010 |

(Continued)

OTHER PUBLICATIONS

Ma et al., Analysis of metal foreign object setting on electric vehicle wireless power transfer system, <Advanced Technology of Electrical Engineering and Energy> vol. 36, No. 2, p. 14-20 ,Feb. 28, 2017.

*Primary Examiner* — Ly D Pham
(74) *Attorney, Agent, or Firm* — Winston Hsu

(57) ABSTRACT

An intruding metal detection method for a supplying-end module of an induction type power supply system having a supplying-end coil includes interrupting at least one driving signal of the induction type power supply system to stop driving the supplying-end coil during a measurement period, to generate a coil signal of the supplying-end coil; measuring a plurality of peaks of the coil signal within a plurality of consecutive oscillation cycles of the coil signal, to obtain a plurality of peak trigger voltages, respectively; calculating a first attenuation parameter according to a first peak trigger
(Continued)

voltage and a second peak trigger voltage among the plurality of peak trigger voltages; and comparing the first attenuation parameter with a first threshold value to determine whether there is an intruding metal existing in a power supply range of the induction type power supply system.

20 Claims, 9 Drawing Sheets

Related U.S. Application Data a continuation-in-part of application No. 15/231,795, filed on Aug. 9, 2016, now Pat. No. 10,289,142, which is a continuation-in-part of application No. 15/005,014, filed on Jan. 25, 2016, now Pat. No. 10,114,396, and a continuation-in-part of application No. 15/197,796, filed on Jun. 30, 2016, now Pat. No. 10,312,748, which is a continuation-in-part of application No. 14/822,875, filed on Aug. 10, 2015, now Pat. No. 9,960,639, and a continuation-in-part of application No. 14/731,421, filed on Jun. 5, 2015, now Pat. No. 10,038,338, which is a continuation-in-part of application No. 13/541,090, filed on Jul. 3, 2012, now Pat. No. 9,075,587, and a continuation-in-part of application No. 14/017,321, filed on Sep. 4, 2013, now Pat. No. 9,628,147, which is a continuation-in-part of application No. 13/212,564, filed on Aug. 18, 2011, now Pat. No. 8,941,267, which is a continuation-in-part of application No. 13/154,965, filed on Jun. 7, 2011, now Pat. No. 8,810,072, said application No. 14/017,321 is a continuation-in-part of application No. 13/541,090, filed on Jul. 3, 2012, now Pat. No. 9,075,587, said application No. 15/197,796 is a continuation-in-part of application No. 14/876,788, filed on Oct. 6, 2015, now Pat. No. 9,831,687, which is a continuation-in-part of application No. 14/017,321, filed on Sep. 4, 2013, now Pat. No. 9,628,147.

(30) Foreign Application Priority Data

| Jan. 14, 2015 | (TW) | ............................. | 104101227 A |
| Jun. 2, 2015 | (TW) | ............................. | 104117722 A |
| Jun. 30, 2015 | (TW) | ............................. | 104121025 A |
| Oct. 28, 2015 | (TW) | ............................. | 104135327 A |
| Apr. 14, 2016 | (TW) | ............................. | 105111620 A |
| May 13, 2016 | (TW) | ............................. | 105114827 A |
| Apr. 27, 2018 | (TW) | ............................. | 107114462 A |

(51) Int. Cl.

| H02J 50/80 | (2016.01) |
| G05B 15/02 | (2006.01) |
| G06F 1/26 | (2006.01) |
| H02J 50/12 | (2016.01) |
| G01V 3/10 | (2006.01) |
| H02J 50/20 | (2016.01) |
| H02J 50/10 | (2016.01) |
| H02J 7/02 | (2016.01) |
| G01R 33/028 | (2006.01) |

(52) U.S. Cl.
CPC .............. *H02J 50/12* (2016.02); *H02J 50/20* (2016.02); *G01R 33/0283* (2013.01); *H02J 7/025* (2013.01); *H02J 50/10* (2016.02)

(58) Field of Classification Search
USPC .......................................................... 700/292
See application file for complete search history.

(56) References Cited

U.S. PATENT DOCUMENTS

| 9,318,897 | B2 | 4/2016 | Brohlin | |
| 9,531,444 | B2 | 12/2016 | Bae | |
| 9,553,485 | B2 | 1/2017 | Singh | |
| 9,995,777 | B2 | 6/2018 | Von Novak, III | |
| 10,056,944 | B2 | 8/2018 | Tsai | |
| 10,122,220 | B2 | 11/2018 | Sankar | |
| 2005/0258826 | A1 | 11/2005 | Kano | |
| 2008/0106273 | A1 | 5/2008 | Bauer | |
| 2009/0167300 | A1 | 7/2009 | Cech | |
| 2009/0278651 | A1 | 11/2009 | Okada | |
| 2009/0319212 | A1 | 12/2009 | Cech | |
| 2010/0098177 | A1 | 4/2010 | Hamaguchi | |
| 2010/0213590 | A1 | 8/2010 | Warren | |
| 2010/0225173 | A1 | 9/2010 | Aoyama | |
| 2011/0062793 | A1 | 3/2011 | Azancot | |
| 2011/0097996 | A1 | 4/2011 | Kalanithi | |
| 2011/0199046 | A1 | 8/2011 | Tsai | |
| 2012/0169132 | A1 | 7/2012 | Choudhary | |
| 2013/0015705 | A1* | 1/2013 | Abe | H02J 5/005 307/29 |
| 2013/0057079 | A1 | 3/2013 | Park | |
| 2013/0065518 | A1 | 3/2013 | Byun | |
| 2013/0082653 | A1 | 4/2013 | Lee | |
| 2013/0106197 | A1 | 5/2013 | Bae | |
| 2013/0147279 | A1 | 6/2013 | Muratov | |
| 2013/0162204 | A1* | 6/2013 | Jung | H02J 17/00 320/108 |
| 2013/0176023 | A1* | 7/2013 | Komiyama | G01R 33/028 324/258 |
| 2013/0187476 | A1* | 7/2013 | Tsai | H02J 17/00 307/104 |
| 2013/0234503 | A1 | 9/2013 | Ichikawa | |
| 2014/0015329 | A1 | 1/2014 | Widmer | |
| 2014/0024919 | A1* | 1/2014 | Metzenthen | H04B 5/0075 600/409 |
| 2014/0152251 | A1* | 6/2014 | Kim | H02J 7/025 320/108 |
| 2014/0197783 | A1 | 7/2014 | Kim | |
| 2015/0008756 | A1* | 1/2015 | Lee | H02J 17/00 307/104 |
| 2015/0028875 | A1* | 1/2015 | Irie | G01V 3/10 324/345 |
| 2015/0180286 | A1 | 6/2015 | Asanuma | |
| 2015/0349573 | A1 | 12/2015 | Tschirhart | |
| 2015/0372493 | A1 | 12/2015 | Sankar | |
| 2015/0372662 | A1 | 12/2015 | Niessen | |
| 2016/0064951 | A1 | 3/2016 | Yamamoto | |
| 2016/0064952 | A1 | 3/2016 | Matsumoto | |
| 2016/0072336 | A1 | 3/2016 | Tamino | |
| 2016/0241086 | A1* | 8/2016 | Jung | H02J 50/80 |
| 2016/0349782 | A1* | 12/2016 | Tsai | G05F 1/66 |
| 2018/0034281 | A1 | 2/2018 | Tsai | |
| 2018/0138756 | A1 | 5/2018 | Bae | |
| 2018/0241257 | A1 | 8/2018 | Muratov | |

FOREIGN PATENT DOCUMENTS

| CN | 101924399 A | 12/2010 |
| CN | 102055250 A | 5/2011 |
| CN | 102157991 A | 8/2011 |
| CN | 103999325 A | 8/2014 |
| CN | 104160300 A | 11/2014 |
| CN | 204190475 U | 3/2015 |
| CN | 105308829 A | 2/2016 |
| CN | 106094041 A | 11/2016 |
| CN | 106134037 A | 11/2016 |
| CN | 106560730 A | 4/2017 |
| CN | 106685029 A | 5/2017 |
| CN | 107615612 A | 1/2018 |

(56) References Cited

FOREIGN PATENT DOCUMENTS

| | | |
|---|---|---|
| EP | 2 555 107 A1 | 2/2013 |
| EP | 3 160 008 A1 | 4/2017 |
| JP | 2016-75484 A | 5/2016 |
| TW | 201315082 A1 | 4/2013 |
| TW | 201417445 A | 5/2014 |
| TW | 201513523 A | 4/2015 |
| TW | 201605143 A | 2/2016 |
| WO | 2016/159788 A1 | 10/2016 |
| WO | 2016/181658 A1 | 11/2016 |

\* cited by examiner

INTRUDING METAL DETECTION METHOD FOR INDUCTION TYPE POWER SUPPLY SYSTEM AND RELATED SUPPLYING-END MODULE

CROSS REFERENCE TO RELATED APPLICATIONS

This application is a continuation-in-part application of U.S. application Ser. No. 15/005,014, filed on Jan. 25, 2016, and a continuation-in-part application of U.S. application Ser. No. 15/231,795, filed on Aug. 9, 2016.

U.S. application Ser. No. 15/231,795 is further a continuation-in-part application of U.S. application Ser. No. 15/005,014, filed on Jan. 25, 2016, and a continuation-in-part application of U.S. application Ser. No. 15/197,796, filed on Jun. 30, 2016.

U.S. application Ser. No. 15/197,796 is further a continuation-in-part application of U.S. application Ser. No. 14/822,875, filed on Aug. 10, 2015, a continuation-in-part application of U.S. application Ser. No. 14/731,421, filed on Jun. 5, 2015, and a continuation-in-part application of U.S. application Ser. No. 14/876,788, filed on Oct. 6, 2015.

U.S. application Ser. No. 14/731,421 is further a continuation-in-part application of U.S. application Ser. No. 14/017,321, filed on Sep. 4, 2013, and a continuation-in-part application of U.S. application Ser. No. 13/541,090, filed on Jul. 3, 2012.

U.S. application Ser. No. 14/017,321 is further a continuation-in-part application of U.S. application Ser. No. 13/541,090, filed on Jul. 3, 2012, and a continuation-in-part application of U.S. application Ser. No. 13/212,564, filed on Aug. 18, 2011.

U.S. application Ser. No. 13/212,564 is further a continuation-in-part application of U.S. application Ser. No. 13/154,965, filed on Jun. 7, 2011.

U.S. application Ser. No. 14/876,788 is further a continuation-in-part application of U.S. application Ser. No. 14/017,321, filed on Sep. 4, 2013.

The contents of these applications are incorporated herein by reference.

BACKGROUND OF THE INVENTION

1. Field of the Invention

The present invention relates to an intruding metal detection method, and more particularly, to an intruding metal detection method applicable to an induction type power supply system.

2. Description of the Prior Art

In an induction type power supply system, a power supply device applies a driver circuit to drive a supplying-end coil to generate resonance, in order to send electromagnetic waves. A coil of the power receiving device may receive the electromagnetic waves and perform power conversion to generate DC power to be supplied for the device in the power receiving end. If the electromagnetic energy sent by the supplying-end coil is exerted on a metal, it may heat the metal. The accumulated heat energies may cause high temperature on the metal, which may burn surrounding objects and thus generate damages. In an induction type power supply system in the prior art, driving operation in the power delivery process may be periodically interrupted to detect the intruding metal, and the intruding metal is determined based on the measured slop variations. However, the output power of the supplying-end coil may be adjusted at any time according to the distance between the supplying-end device and the receiving-end device. For example, the output power may be larger with a farer coil distance, and the output power may be smaller with a nearer coil distance. With variations of output power, the amplitude of the coil signal may also change, such that the attenuation patterns of resonant signals due to interrupted driving of the coil may also be different. Therefore, when the output power changes, the supplying-end device needs to spend several detection cycles to adjust the voltage setting of the comparator to track the signal's peak values. If the coil voltage is unstable due to influences of power or loading, it is hard to track the peak values to determine the attenuation slope.

In addition, in order to determine the attenuation slope, the driving signal should be interrupted for a period of time. However, the operations of interrupting the driving signal during wireless charging may reduce the entire power output capability. If the interrupting time is excessively long, the power supply efficiency may be reduced. Also, recovery of the driving signal after the long interrupting time may easily generate excessive electromagnetic interference (EMI). In the prior art, a comparator module is applied to obtain multiple peak voltage levels, so as to determine slope variations between multiple sections in the attenuation of the coil signal; hence, a longer interrupting time may be required. Taking U.S. application Ser. No. 15/231,795 as an example, 7-15 oscillation cycles of the coil are required to accomplish the measurement of four peak voltage levels to determine the variations of attenuation slope.

Thus, there is a need to provide another intruding metal detection method, which is capable of finishing metal detection within a short interrupting time of coil driving, and also preventing the variations of output power or loading from influencing the detection results.

SUMMARY OF THE INVENTION

It is therefore an objective of the present invention to provide an intruding metal detection method capable of finishing the metal detection within a short interrupting time of coil driving, where the detection of intruding metal may be accomplished in 2-3 coil oscillation cycles in minimum. In addition, the intruding metal detection method of the present invention may perform determination according to the attenuation ratio of the coil signal, which solves the problems in the prior art where the determination method based on attenuation slope is easily influenced by the coil amplitude and the loading.

An embodiment of the present invention discloses an intruding metal detection method for a supplying-end module of an induction type power supply system. The supplying-end module comprises a supplying-end coil. The intruding metal detection method comprises interrupting at least one driving signal of the induction type power supply system to stop driving the supplying-end coil during a measurement period, to generate a coil signal of the supplying-end coil; measuring a plurality of peaks of the coil signal within a plurality of consecutive oscillation cycles of the coil signal, to obtain a plurality of peak trigger voltages, respectively; calculating a first attenuation parameter according to a first peak trigger voltage and a second peak trigger voltage among the plurality of peak trigger voltages; and comparing the first attenuation parameter with a first threshold value to determine whether there is an intruding metal existing in a power supply range of the induction type power supply system.

Another embodiment of the present invention discloses a supplying-end module for an induction type power supply system for performing an intruding metal detection method. The supplying-end module comprises a supplying-end coil, a resonant capacitor, at least one power driver unit, a signal receiver and a processor. The resonant capacitor, coupled to the supplying-end coil, is used for performing resonance together with the supplying-end coil. The at least one power driver unit, coupled to the supplying-end coil and the resonant capacitor, is used for sending at least one driving signal to the supplying-end coil to drive the supplying-end coil to generate energies, and interrupting the at least one driving signal to stop driving the supplying-end coil during a measurement period to generate a coil signal of the supplying-end coil. The signal receiver, coupled to the supplying-end coil, is used for receiving the coil signal from the supplying-end coil. The processor, coupled to the signal receiver, is used for performing the following steps: measuring a plurality of peaks of the coil signal within a plurality of consecutive oscillation cycles of the coil signal, to obtain a plurality of peak trigger voltages, respectively; calculating a first attenuation parameter according to a first peak trigger voltage and a second peak trigger voltage among the plurality of peak trigger voltages; and comparing the first attenuation parameter with a first threshold value to determine whether there is an intruding metal existing in a power supply range of the induction type power supply system.

Another embodiment of the present invention discloses an intruding metal detection method for a supplying-end module of an induction type power supply system. The supplying-end module comprises a supplying-end coil. The intruding metal detection method comprises obtaining a previous peak trigger voltage measured during a previous measurement period and setting a reference voltage to be equal to the previous peak trigger voltage; interrupting at least one driving signal of the induction type power supply system to stop driving the supplying-end coil during a measurement period, to generate a coil signal of the supplying-end coil; measuring a first peak of the coil signal within an oscillation cycle of the coil signal, to obtain a first peak trigger voltage; comparing the first peak trigger voltage with the reference voltage; and determining that there is no intruding metal existing in a power supply range of the induction type power supply system when the first peak trigger voltage is equal to or close to the reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
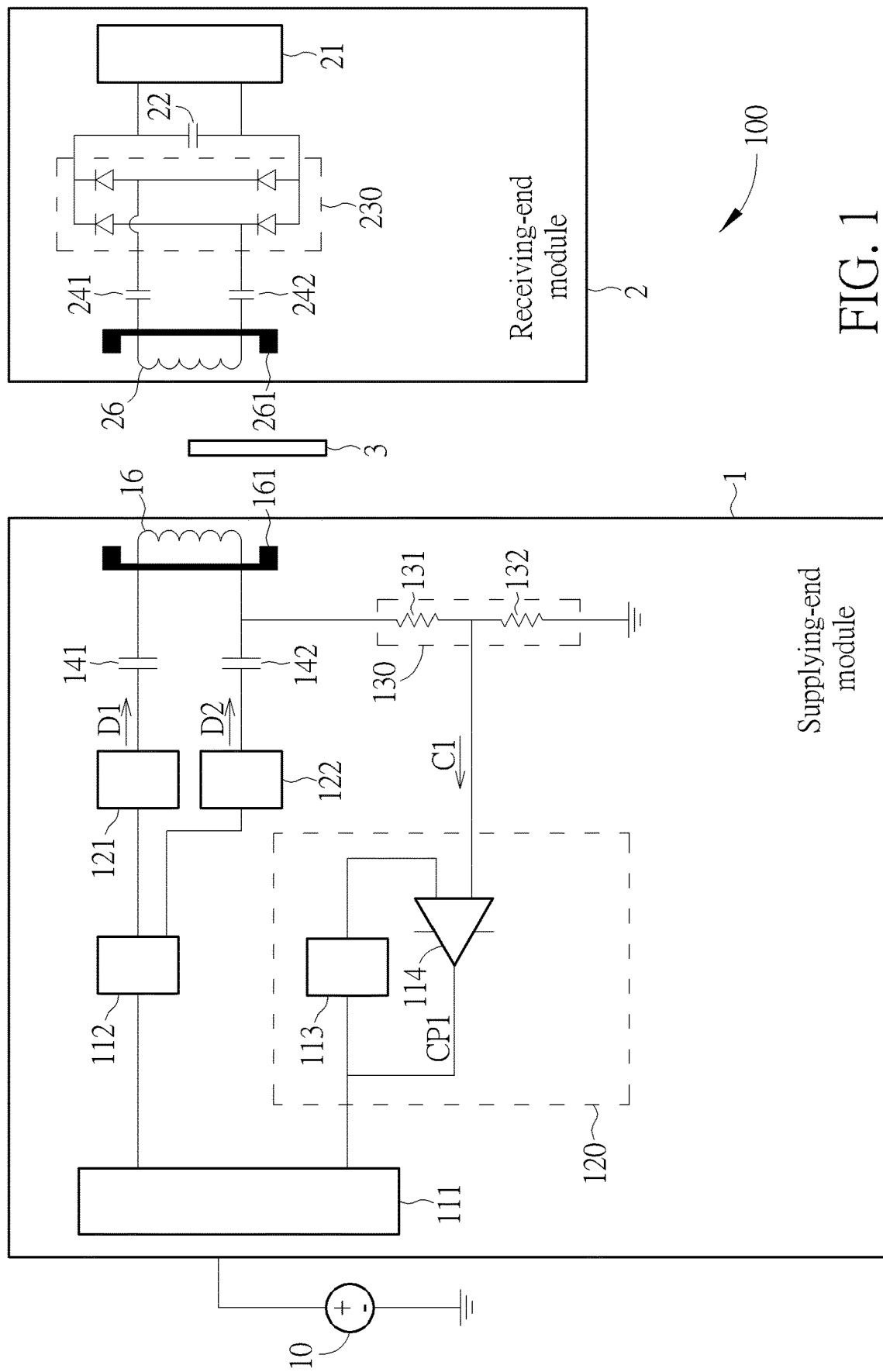
FIG. 1 is a schematic diagram of an induction type power supply system according to an embodiment of the present invention.

Please refer to FIG. 1, which is a schematic diagram of an induction type power supply system 100 according to an embodiment of the present invention. As shown in FIG. 1, the induction type power supply system 100 includes a supplying-end module 1 and a receiving-end module 2. The supplying-end module 1 receives power from a power supply device 10 and outputs wireless power to the receiving-end module 2. The supplying-end module 1 includes a supplying-end coil 16 and resonant capacitors 141 and 142, disposed as a C-L-C structure. The supplying-end coil 16 is used for delivering electromagnetic energies to the receiving-end module 2 to supply power. The resonant capacitors 141 and 142, coupled to the two terminals of the supplying-end coil 16, respectively, are used for performing resonance together with the supplying-end coil 16 during power supply. In addition, in the supplying-end module 1, a magnetic conductor 161 composed of magnetic materials may be selectively disposed, to enhance the electromagnetic induction capability of the supplying-end coil 16 and also prevent electromagnetic energies from affecting the objects located in the non-inducting side of the coil.

In order to control the operations of the supplying-end coil 16 and the resonant capacitors 141 and 142, the supplying-end module 1 further includes a processor 111, a clock generator 112, power driver units 121 and 122, a signal receiver 120 and a voltage dividing circuit 130. The power driver units 121 and 122, coupled to the supplying-end coil 16 and the resonant capacitors 141 and 142, are used for sending driving signals D1 and D2 to the supplying-end coil 16, respectively. The power driver units 121 and 122 may be controlled by the processor 111, for driving the supplying-end coil 16 to generate and send power. When the power driver units 121 and 122 are both active, full-bridge driving is performed. In another embodiment, only one of the power driver units 121 and 122 is active or only one of the power driver units 121 and 122 is disposed, which leads to half-bridge driving. The clock generator 112, coupled to the power driver units 121 and 122, is used for controlling the power driver units 121 and 122 to send the driving signals D1 and D2. The clock generator 112 may be a pulse width modulation (PWM) generator or other type of clock generator, for outputting a clock signal to the power driver units 121 and 122. The processor 111 may receive information related to a coil signal C1 (i.e., the voltage signal between the supplying-end coil 16 and the resonant capacitor 142) from the supplying-end coil 16, such as the resonant frequency or attenuation degree of the coil signal C1, and determine whether there is an intruding metal accordingly. The processor 111 may be a central processing unit (CPU), a microprocessor, a micro controller unit (MCU), or other type of processing device or computation device. The signal receiver 120 is used for tracking the resonant frequency and the peak values of the coil signal C1, and providing information related to the resonant frequency and the peak values for the processor 111 for follow-up interpretation. The voltage dividing circuit 130, which includes voltage dividing resistors 131 and 132, may attenuate the coil signal C1 on the supplying-end coil 16 and then output the coil signal C1 to the processor 111 and the signal receiver 120. In some embodiments, if the tolerance voltage of the circuits such as the processor 111 and the signal receiver 120 is high enough, the voltage dividing circuit 130 may not be disposed and the processor 111 may directly receive the coil signal C1 from the supplying-end coil 16. Other possible components or modules such as a power supply unit and display unit may be included or not according to system requirements. These components are omitted herein without affecting the illustrations of the present embodiments.

In an embodiment, the signal receiver 120 includes a voltage generator 113 and a comparator 114, as shown in FIG. 1. The voltage generator 113 may be a digital to analog converter (DAC), which may receive the information of a reference voltage from the processor 111, and convert it into an analog voltage and then output the analog voltage. An input terminal of the comparator 114 may receive a reference voltage, and another input terminal of the comparator 114 may receive the coil signal C1 from the supplying-end coil 16, so as to compare the coil signal C1 with the reference voltage. The processor 111 then performs follow-up determination and signal processing operations according to the above comparison result. Note that the signal receiver 120 may also be integrated in the processor 111, and the implementation method is not limited herein.

Please keep referring to FIG. 1. The receiving-end module 2 includes a load unit 21, a capacitor 22, a rectification circuit 230, a receiving-end coil 26 and resonant capacitors 241 and 242. In the receiving-end module 2, a magnetic conductor 261 composed of magnetic materials may also be selectively disposed, to enhance the electromagnetic induction capability of the receiving-end coil 26 and also prevent electromagnetic energies from affecting the objects located in the non-inducting side of the coil. The receiving-end coil 26 may receive electric power from the supplying-end coil 16 and send the received power to the rectification circuit 230 for rectification. After the rectification is accomplished, the power is transmitted to the capacitor 22 and the load unit 21 at the back end. The capacitor 22 may be a filter capacitor for performing filtering, a regulating capacitor for stabilizing the output voltage, or their combinations; this should not be limited herein. In the receiving-end module 2, other possible components or modules such as a feedback circuit and receiving-end microprocessor may be included or not according to system requirements. These components are omitted herein without affecting the illustrations of the present embodiments.

In addition, an intruding metal 3 is not included in the induction type power supply system 100, but is illustrated between the supplying-end module 1 and the receiving-end module 2 in FIG. 1 to facilitate the description. When the intruding metal 3 is located in a power supply range of the induction type power supply system 100, the intruding metal 3 may receive electromagnetic energies sent by the supplying-end module 1 and thus be heated. The intruding metal detection method of the present invention is configured to determine whether there is an intruding metal 3 existing in the power supply range of the induction type power supply system 100, and stop sending power when determining that the intruding metal 3 exists.

Figure 2:
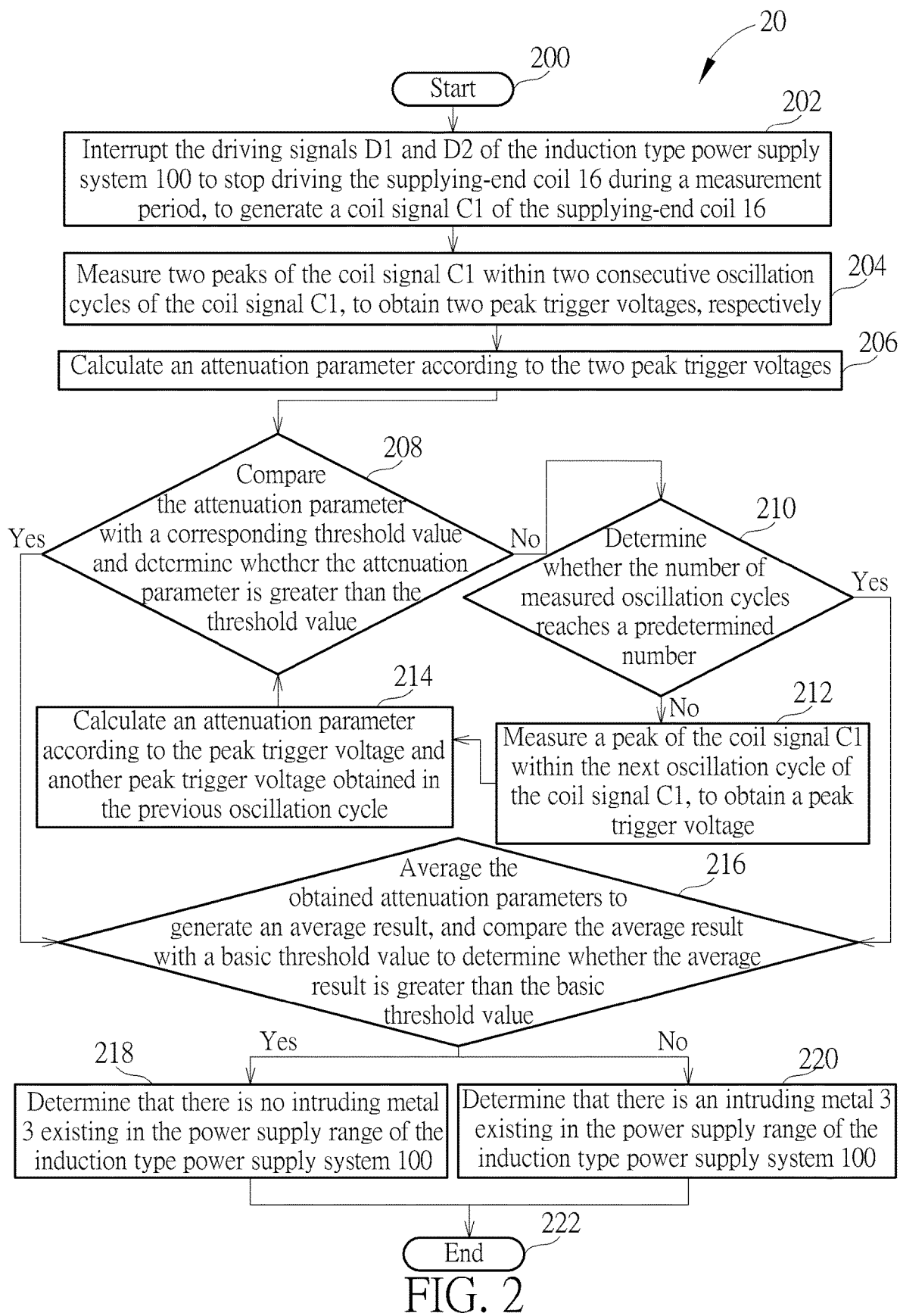
FIG. 2 is a schematic diagram of an intruding metal detection process according to an embodiment of the present invention.

Different from the prior art where the supplying-end module determines an intruding metal by measuring the variations of attenuation slope of the coil, the present invention performs determination on intruding metal by measuring the ratio of voltage attenuation of the coil signal. Please refer to FIG. 2, which is a schematic diagram of an intruding metal detection process 20 according to an embodiment of the present invention. As shown in FIG. 2, the intruding metal detection process 20, which may be utilized in a supplying-end device of an induction type power supply system such as the supplying-end module 1 of the induction type power supply system 100 shown in FIG. 1, includes the following steps:

Step 200: Start.

Step 202: Interrupt the driving signals D1 and D2 of the induction type power supply system 100 to stop driving the supplying-end coil 16 during a measurement period, to generate a coil signal C1 of the supplying-end coil 16.

Step 204: Measure two peaks of the coil signal C1 within two consecutive oscillation cycles of the coil signal C1, to obtain two peak trigger voltages, respectively.

Step 206: Calculate an attenuation parameter according to the two peak trigger voltages.

Step 208: Compare the attenuation parameter with a corresponding threshold value and determine whether the attenuation parameter is greater than the threshold value. If yes, go to Step 216; otherwise, go to Step 210.

Step 210: Determine whether the number of measured oscillation cycles reaches a predetermined number. If yes, go to Step 216; otherwise, go to Step 212.

Step 212: Measure a peak of the coil signal C1 within the next oscillation cycle of the coil signal C1, to obtain a peak trigger voltage.

Step 214: Calculate an attenuation parameter according to the peak trigger voltage and another peak trigger voltage obtained in the previous oscillation cycle.

Step 216: Average the obtained attenuation parameters to generate an average result, and compare the average result with a basic threshold value to determine whether the average result is greater than the basic threshold value. If yes, go to Step 218; otherwise, go to Step 220.

Step 218: Determine that there is no intruding metal 3 existing in the power supply range of the induction type power supply system 100.

Step 220: Determine that there is an intruding metal 3 existing in the power supply range of the induction type power supply system 100.

Step 222: End.

Figure 3:
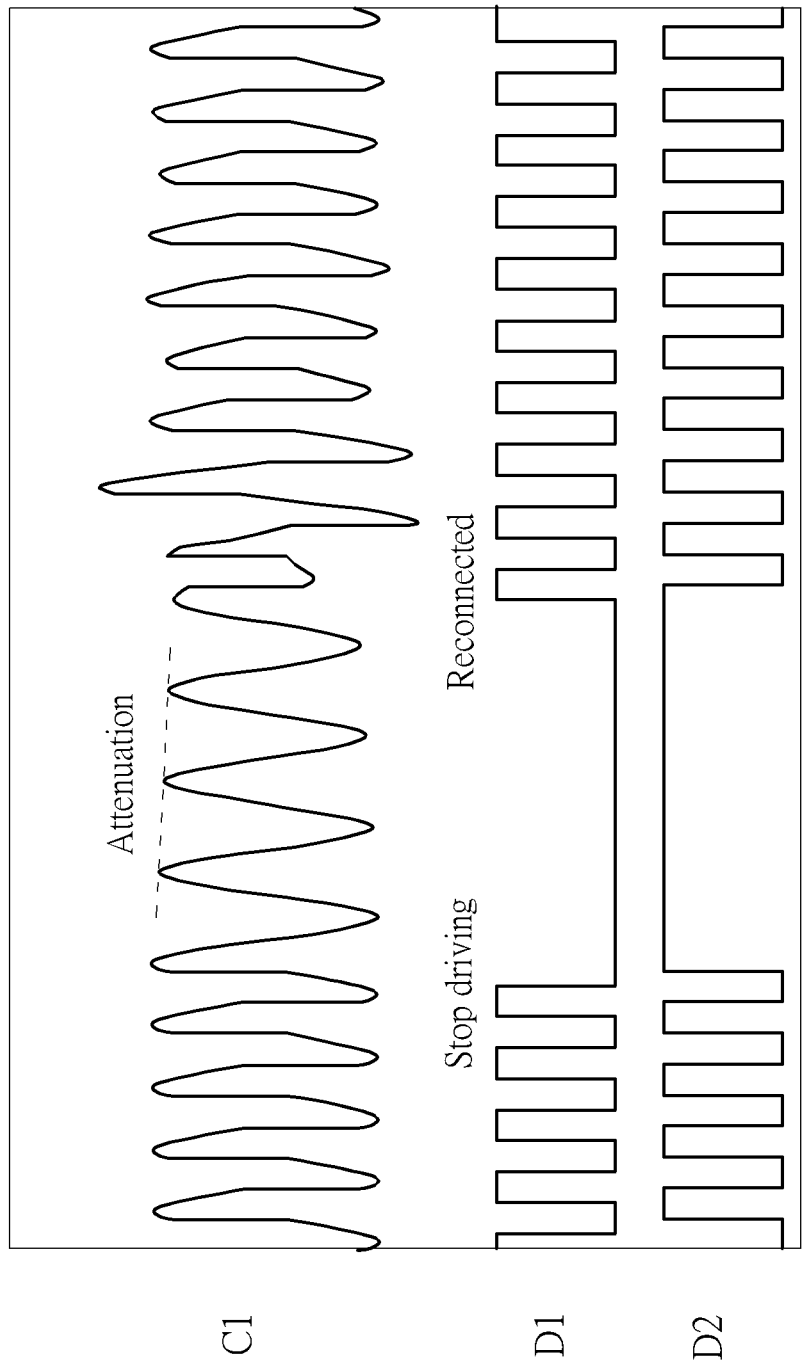
FIG. 3 is a schematic diagram of stopping driving the supplying-end coil during a measurement period.

According to the intruding metal detection process 20, in the supplying-end module 1 of the induction type power supply system 100, the driving signals D1 and D2 may be interrupted for a period of time during the driving operation. At this moment, the power driver units 121 and 122 may stop driving the supplying-end coil 16. When the supplying-end coil 16 stops driving, the coil signal C1 may keep oscillating and attenuate gradually since there are still energies existing between the supplying-end coil 16 and the resonant capacitors 141 and 142. As shown in FIG. 3, when driving is stopped, the driving signals D1 and D2 stay in the high voltage level and the low voltage level for a period of time, respectively. At this moment, the coil signal C1 appears to have an oscillating and attenuating waveform. Afterwards, the power driver units 121 and 122 are reconnected to output the square-wave driving signals D1 and D2 to drive the supplying-end coil 16 to output power again. In another embodiment, the driving signals D1 and D2 may be controlled to simultaneously stay in the high voltage level or simultaneously stay in the low voltage level to stop driving, and this is not limited herein. The abovementioned period where the driving signals D1 and D2 are interrupted is configured for measuring the resonance of the coil signal C1 to perform detection of the intruding metal 3, and will be called "measurement period" hereinafter for easy understanding.

Figure 4:
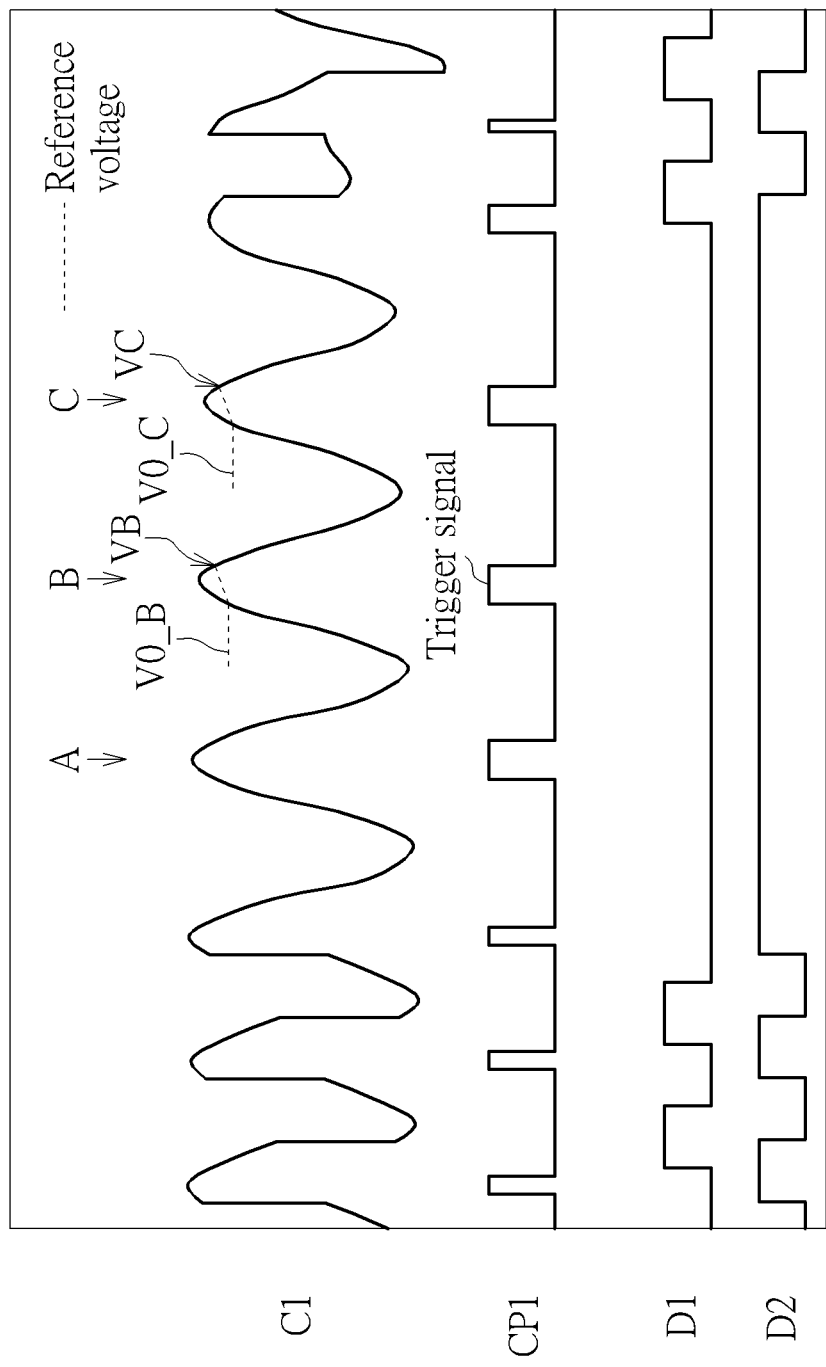
FIGS. 4-7 are schematic diagrams of obtaining peak trigger voltages during a measurement period according to an embodiment of the present invention.

During the measurement period, a plurality of consecutive oscillation cycles exist in the coil signal C1. The processor 111 may measure the peaks of the coil signal C1 within the plurality of oscillation cycles, to obtain a plurality of peak trigger voltages, respectively. Please refer to FIG. 4, which is a schematic diagram of obtaining peak trigger voltages VB and VC during a measurement period according to an embodiment of the present invention. As shown in FIG. 4, the coil signal C1 includes three peaks A, B and C during the measurement period. Since the first peak A occurs in the time period when the driving signals D1 and D2 just stop driving, the oscillation at the peak A may still influenced by the driving signals D1 and D2 and may not be considered as intrinsic oscillation of the supplying-end coil 16; hence, the height of the peak A may not reach the height of intrinsic oscillation. In such a condition, in order to prevent that determination of the intruding metal 3 is influenced by the driving signals D1 and D2 and thus gets distorted, the measurement of the peak trigger voltage of the peak A may be omitted, and only the peak trigger voltages VB and VC of the peaks B and C are measured.

In an oscillation cycle for measuring a peak, the processor 111 may set a reference voltage (illustrated as a dotted line in FIG. 4). The voltage generator 113 may output the reference voltage to the comparator 114, and the comparator 114 may compare the reference voltage with the coil signal C1 to generate a comparison result CP1. In detail, before entering the oscillation cycle corresponding to the peak B, the processor 111 may preset the reference voltage to be equal to a trigger initiation voltage V0_B. Subsequently, after the voltage level of the coil signal C1 rises above the reference voltage to generate a trigger signal at the output terminal of the comparator 114 (i.e., a high voltage level appears in the comparison result CP1), the processor 111 may control the reference voltage to rise gradually. When the reference voltage reaches the voltage level of the coil signal C1, the processor 111 may determine that the trigger signal ends (i.e., the comparison result CP1 returns to the low voltage level). At this moment, the processor 111 may obtain the level of the reference voltage as the peak trigger voltage VB corresponding to the peak B. Similarly, for the oscillation cycle corresponding to the peak C, the processor 111 may preset the reference voltage to be equal to a trigger initiation voltage V0_C, and thereby obtain the peak trigger voltage VC corresponding to the peak C in the same manner.

Subsequently, the processor 111 may calculate a first attenuation parameter PAR1 according to the peak trigger voltage VB and the peak trigger voltage VC. In detail, the first attenuation parameter PAR1 may be a ratio of the average of the peak trigger voltage VB and the peak trigger voltage VC relative to the difference of the peak trigger voltage VB and the peak trigger voltage VC. In an embodiment, the processor 111 may calculate the summation result of the peak trigger voltage VB and the peak trigger voltage VC divided by the subtraction result of the peak trigger voltage VB and the peak trigger voltage VC to obtain the first attenuation parameter PAR1, and the detailed calculation is shown below:

$$PAR1 = \frac{VB + VC}{VB - VC}$$

Please note that, in U.S. application Ser. No. 15/231,795, determination of the intruding metal is performed using the variations of attenuation slope, i.e., the variations of attenuation quantities. However, in the situation where no intruding metal exists, the attenuation quantity may be larger after interruption of coil driving if the output power is higher (i.e., the amplitude of the coil signal C1 is larger); and the attenuation quantity may be smaller after interruption of coil driving if the output power is lower (i.e., the amplitude of the coil signal C1 is smaller). That is, the attenuation quantity and the output power may vary with a substantially identical ratio. For example, in the situation where no intruding metal exists, if the peak trigger voltage VB is equal to 100 units of voltage, the peak trigger voltage VC may be approximately equal to 90 units of voltage; and if the peak trigger voltage VB is equal to 50 units of voltage, the peak trigger voltage VC may be approximately equal to 45 units of voltage. The attenuation quantities of peak values are different in these two cases. Therefore, in the present invention, the ratio of the average or summation of the peak trigger voltages relative to the difference (i.e., the attenuation quantity) of the peak trigger voltages is applied to calculate the attenuation parameter. The calculation method eliminates the influence on attenuation of the coil signal from the output power, in order to achieve more effective determination of intruding metal. In this embodiment, a larger attenuation parameter stands for a slower attenuation speed, which means the intruding metal is less probably to exist; and a smaller attenuation parameter stands for a faster attenuation speed, which means the intruding metal is more probably to exist.

It should also be noted that a peak trigger voltage is always unequal to the peak voltage of the corresponding peak. In fact, the peak trigger voltage is slightly lower than the peak voltage of the corresponding peak. As shown in FIG. 4, the peak trigger voltage VB is close to and slightly lower than the voltage of the peak B, and the peak trigger voltage VC is close to and slightly lower than the voltage of the peak C. The trigger initiation voltages V0_B and V0_C are set to values slightly lower than the voltage levels of the peak B and the peak C, respectively; hence, the reference voltage after rising may intersect the coil signal C1 at the right-hand side of the peak, such that the peak trigger voltages VB and VC obtained based on the reference voltage may also be slightly lower than and close to the corresponding peak voltages, respectively. In addition, according to the above calculation method of the attenuation parameter, the value of the attenuation parameter is mainly influenced by the attenuation ratio. Therefore, if the peak trigger voltages slightly lower than the peak voltages are applied as the calculation basis, the obtained determination result of intruding metal is substantially identical to the determination result obtained based on the peak voltages. As long as the attenuation parameter may reflect the attenuation quantity or attenuation ratio, the attenuation parameter is feasible to determine the intruding metal 3.

As mentioned above, the first attenuation parameter PAR1 is equal to the summation result of the peak trigger voltage VB and the peak trigger voltage VC divided by the subtraction result of the peak trigger voltage VB and the peak trigger voltage VC. After the first attenuation parameter PAR1 is obtained, the processor 111 may set a first threshold value TH1 and compare the first attenuation parameter PAR1 with the first threshold value TH1 to determine whether there is an intruding metal 3 existing in a power supply range of the induction type power supply system 100. In an embodiment, when the first attenuation parameter PAR1 is greater than the first threshold value TH1, the processor 111 may determine that there is no intruding metal 3 existing in the power supply range of the induction type power supply system 100; and when the first attenuation parameter PAR1 is smaller than the first threshold value TH1, the processor 111 further performs follow-up determination. In the induction type power supply system, there are large noises in the power supply terminal and/or the loading terminal, and the noises may easily interfere with analysis and detection of the coil signal. Therefore, the related data or determination result of intruding metal should be obtained by more times to accurately determine the intruding metal, in order to avoid wrong determination of intruding metal to erroneously disable the power output function due to noise interference.

In an embodiment, the processor 111 may set a basic threshold value TH0. During the testing process of induction type power supply products, the attenuation parameter may vary between different products and different environments. The basic threshold value TH0 may be set according to the lowest attenuation parameter measured without existence of any intruding metal. Preferably, the basic threshold value TH0 may be set to a lower value with a broader determination criterion, to prevent noise interference from being wrongly determined to be an intruding metal. The processor 111 then adds different values to the basic threshold value TH0 to obtain a plurality of threshold values, respectively, such as the first threshold value TH1, the second threshold value TH2, and the third threshold value TH3. The processor 111 may compare the first attenuation parameter PAR1, the second attenuation parameter PAR2, the third attenuation parameter PAR3 and the fourth attenuation parameter PAR4 obtained during a measurement period with the first threshold value TH1, the second threshold value TH2, the third threshold value TH3 and the basic threshold value TH0, respectively, to perform determination on the intruding metal 3. For example, the processor 111 may set the basic threshold value TH0 to 150. The processor 111 then sets that the first threshold value TH1 is equal to the basic threshold value TH0=150 plus 30, i.e., 180; the second threshold value TH2 is equal to the basic threshold value TH0=150 plus 20, i.e., 170; and the third threshold value TH3 is equal to the basic threshold value TH0=150 plus 10, i.e., 160. In this embodiment, the first threshold value TH1 is greater than the second threshold value TH2, and the second threshold value TH2 is greater than the third threshold value TH3.

First, the processor 111 compares the first attenuation parameter PAR1 with the first threshold value TH1. In an embodiment (as shown in Table 1), the processor 111 may obtain the peak trigger voltage VB equal to 1000 units of voltage and the peak trigger voltage VC equal to 990 units of voltage. After calculation, the first attenuation parameter PAR1 is obtained as 199. The first attenuation parameter PAR1=199 is greater than the first threshold value TH1=180, which means that the first attenuation parameter is far greater than the basic threshold value TH0. Therefore, the processor 111 determines that no intruding metal 3 exists.

TABLE 1

| Peak/Oscillation cycle | B | C | x | x | x |
|---|---|---|---|---|---|
| Peak trigger voltage | 1000 | 990 | x | x | x |
| Attenuation parameter | | 199 | x | x | x |
| Threshold value | | 180 | 170 | 160 | 150 |

In this embodiment, the first attenuation parameter PAR1 is greater than the first threshold value TH1 and is far greater than the basic threshold value TH0, which means that the probability that an intruding metal 3 exists is quite low, and the system is quite safe; hence, the processor 111 directly determines that there is no intruding metal 3. In such a condition, determination of the intruding metal 3 may be accomplished with only 2 oscillation cycles measured by the processor 111. In other words, the measurement period during which the driving signals D1 and D2 interrupt may only include 3 oscillation cycles, wherein no measurement is performed in the oscillation cycle corresponding to the peak A, and determination of the intruding metal 3 is accomplished after peak measurements in the oscillation cycles corresponding to the peaks B and C are accomplished and the first attenuation parameter PAR1 is obtained.

In an embodiment, the first attenuation parameter PAR1 is smaller than the first threshold value TH1. At this moment, the processor 111 further performs follow-up determination of the intruding metal 3, as shown in Table 2.

TABLE 2

| Peak/Oscillation cycle | B | C | D | x | x |
|---|---|---|---|---|---|
| Peak trigger voltage | 1000 | 988 | 977 | x | x |
| Attenuation parameter | | 166 | 179 | x | x |
| Threshold value | | 180 | 170 | 160 | 150 |

Figure 5:
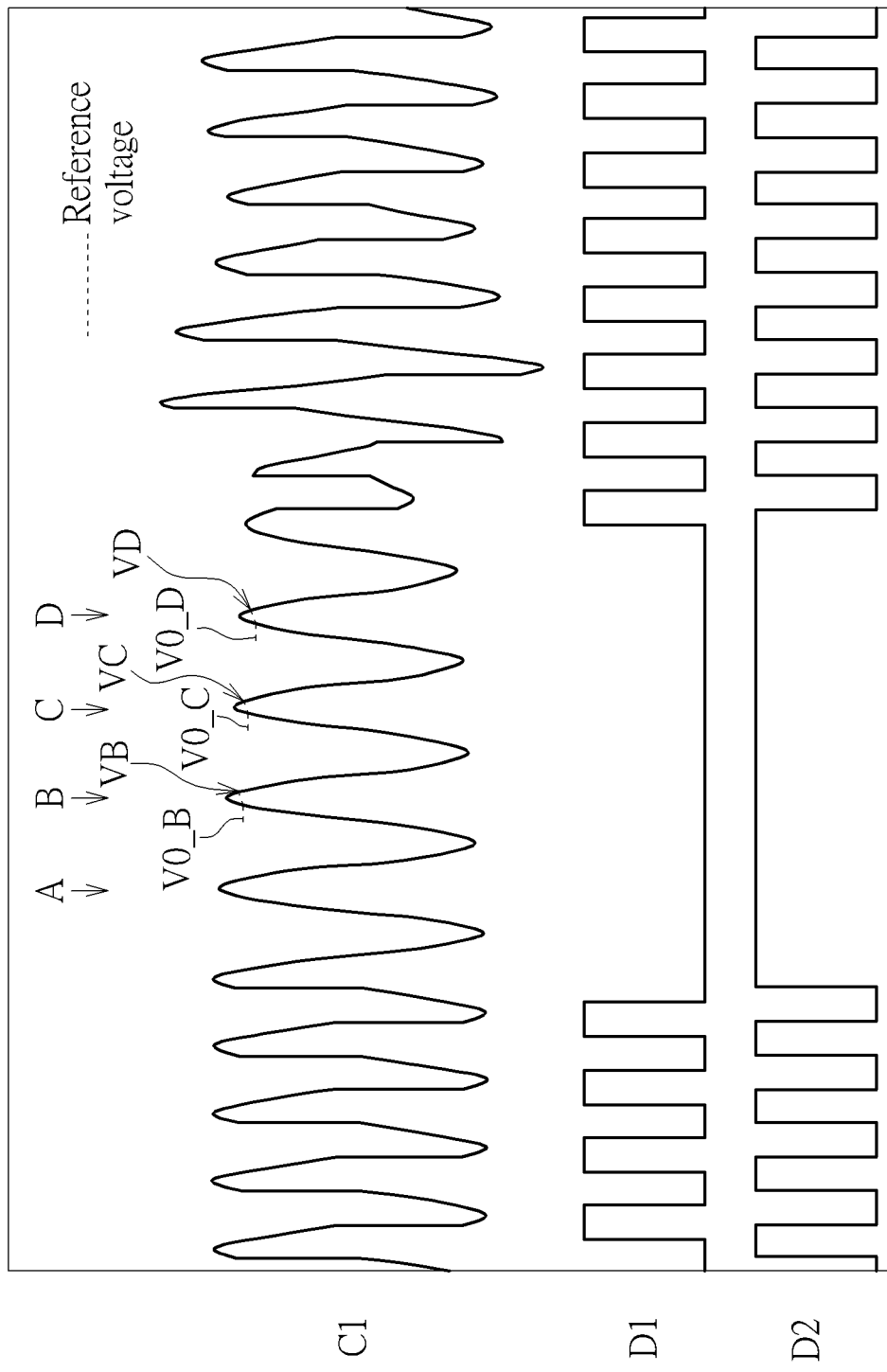

In detail, the processor 111 first compares the first attenuation parameter PAR1 with the first threshold value TH1. After determining that the first attenuation parameter PAR1=166 is smaller than the first threshold value TH1=180, the processor 111 may measure the next oscillation cycle of the coil signal C1 (i.e., the oscillation cycle corresponding to the peak D). As shown in FIG. 5, within the oscillation cycle of the peak D, the processor 111 may preset the reference voltage to be equal to a trigger initiation voltage V0_D, and obtain the peak trigger voltage VD corresponding to the peak D according to the above method. The processor 111 then calculates a second attenuation parameter PAR2 according to the peak trigger voltage VC and the peak trigger voltage VD. In detail, the processor 111 may calculate the summation result of the peak trigger voltage VC and the peak trigger voltage VD divided by the subtraction result of the peak trigger voltage VC and the peak trigger voltage VD to obtain the second attenuation parameter PAR2, and the detailed calculation is shown below:

$$PAR2 = \frac{VC + VD}{VC - VD}$$

In this embodiment, the peak trigger voltage VC is equal to 988 units of voltage and the peak trigger voltage VD is equal to 977 units of voltage. After calculation, the second attenuation parameter PAR2 is obtained as 179 (rounded to the nearest integer). The processor 111 then compares the second attenuation parameter PAR2 with the second threshold value TH2, and determines that the second attenuation parameter PAR2=179 is greater than the second threshold value TH2=170. In such a condition, the processor 111 stops measuring the subsequent oscillation cycles in this measurement period. Further, the processor 111 averages the first attenuation parameter PAR1 and the second attenuation parameter PAR2 obtained in the measurement period, and compares the above average result with the basic threshold value TH0 to perform determination on the intruding metal 3. In this embodiment, the average value of the first attenuation parameter PAR1 and the second attenuation parameter PAR2 is greater than the basic threshold value TH0. Therefore, the processor 111 determines that there is no intruding metal 3 existing in the power supply range of the induction type power supply system 100.

In another embodiment, the second attenuation parameter PAR2 may be smaller than the second threshold value TH2. At this moment, the processor 111 further performs follow-up determination of the intruding metal 3, as shown in Table 3.

TABLE 3

| Peak/Oscillation cycle | B | C | D | E | × |
|---|---|---|---|---|---|
| Peak trigger voltage | 1000 | 986 | 974 | 962 | × |
| Attenuation parameter | | 142 | 163 | 161 | × |
| Threshold value | | 180 | 170 | 160 | 150 |

Figure 6:
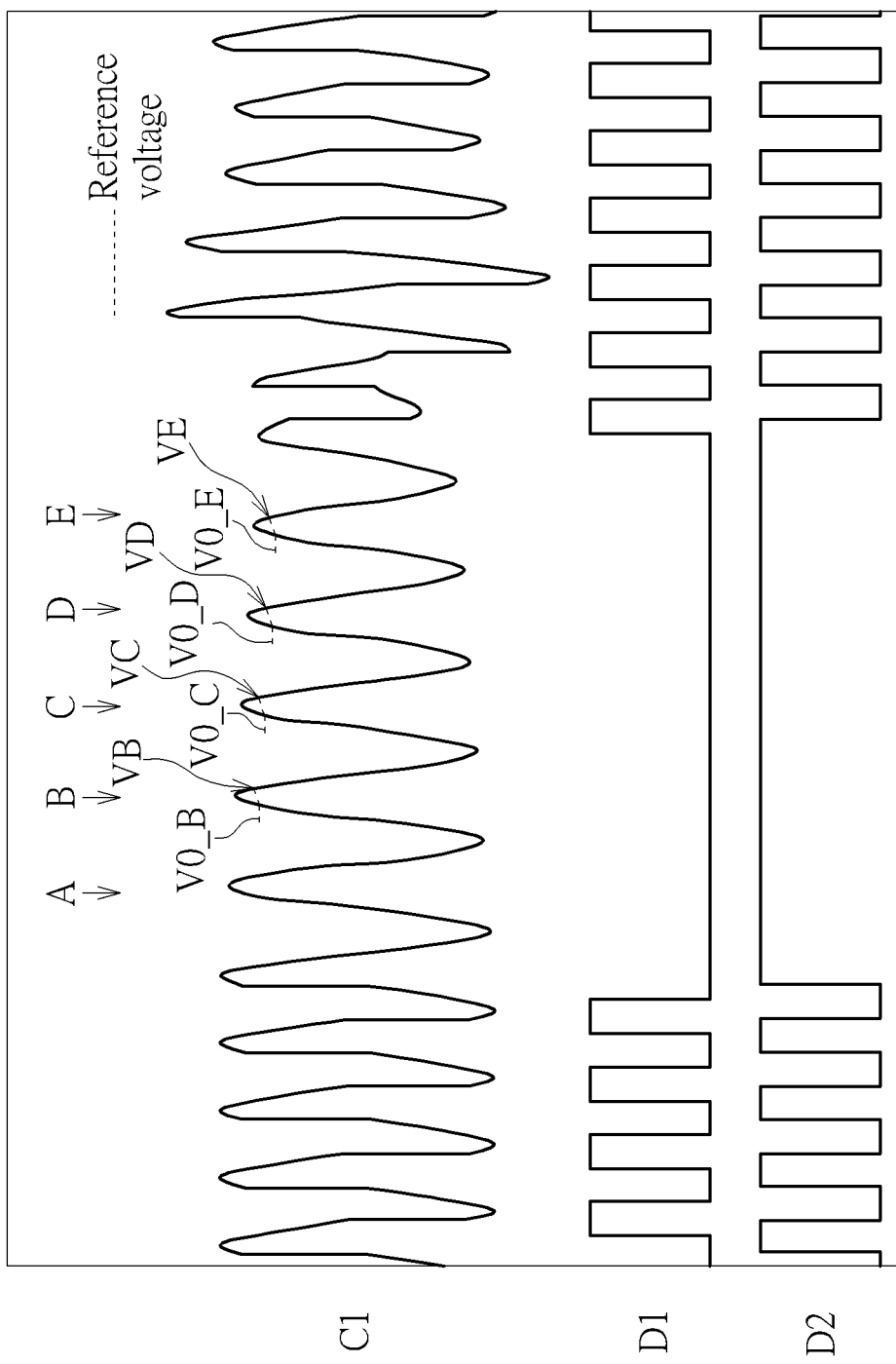

In detail, the processor 111 first compares the first attenuation parameter PAR1 with the first threshold value TH1. After determining that the first attenuation parameter PAR1=142 is smaller than the first threshold value TH1=180, the processor 111 may measure the next oscillation cycle of the coil signal C1 (i.e., the oscillation cycle corresponding to the peak D) to obtain the second attenuation parameter PAR2, and compare the second attenuation parameter PAR2 with the second threshold value TH2. Subsequently, after determining that the second attenuation parameter PAR2=163 is smaller than the second threshold value TH2=170, the processor 111 may measure the next oscillation cycle of the coil signal C1 (i.e., the oscillation cycle corresponding to the peak E). As shown in FIG. 6, within the oscillation cycle of the peak E, the processor 111 may preset the reference voltage to be equal to a trigger initiation voltage V0_E, and obtain the peak trigger voltage VE corresponding to the peak E according to the above method. The processor 111 then calculates a third attenuation parameter PAR3 according to the peak trigger voltage VD and the peak trigger voltage VE. In detail, the processor 111 may calculate the summation result of the peak trigger voltage VD and the peak trigger voltage VE divided by the subtraction result of the peak trigger voltage VD and the peak trigger voltage VE to obtain the third attenuation parameter PAR3, and the detailed calculation is shown below:

$$PAR3 = \frac{VD + VE}{VD - VE}$$

In this embodiment, the peak trigger voltage VD is equal to 974 units of voltage and the peak trigger voltage VE is equal to 962 units of voltage. After calculation, the third attenuation parameter PAR3 is obtained as 161 (rounded to the nearest integer). The processor 111 then compares the third attenuation parameter PAR3 with the third threshold value TH3, and determines that the third attenuation parameter PAR3=161 is greater than the third threshold value TH3=160. In such a condition, the processor 111 stops measuring the subsequent oscillation cycles in this measurement period. Further, the processor 111 averages the first attenuation parameter PAR1, the second attenuation parameter PAR2 and the third attenuation parameter PAR3 obtained in the measurement period, and compares the above average result with the basic threshold value TH0 to perform determination on the intruding metal 3. In this embodiment, the average value of the first attenuation parameter PAR1, the second attenuation parameter PAR2 and the third attenuation parameter PAR3 is greater than the basic threshold value TH0. Therefore, the processor 111 determines that there is no intruding metal 3 existing in the power supply range of the induction type power supply system 100.

In another embodiment, the third attenuation parameter PAR3 may be smaller than the third threshold value TH3. At this moment, the processor 111 further performs follow-up determination of the intruding metal 3, as shown in Table 4.

TABLE 4

| Peak/Oscillation cycle | B | C | D | E | F |
|---|---|---|---|---|---|
| Peak trigger voltage | 1000 | 984 | 968 | 952 | 936 |
| Attenuation parameter | | 124 | 122 | 120 | 118 |
| Threshold value | | 180 | 170 | 160 | 150 |

Figure 7:
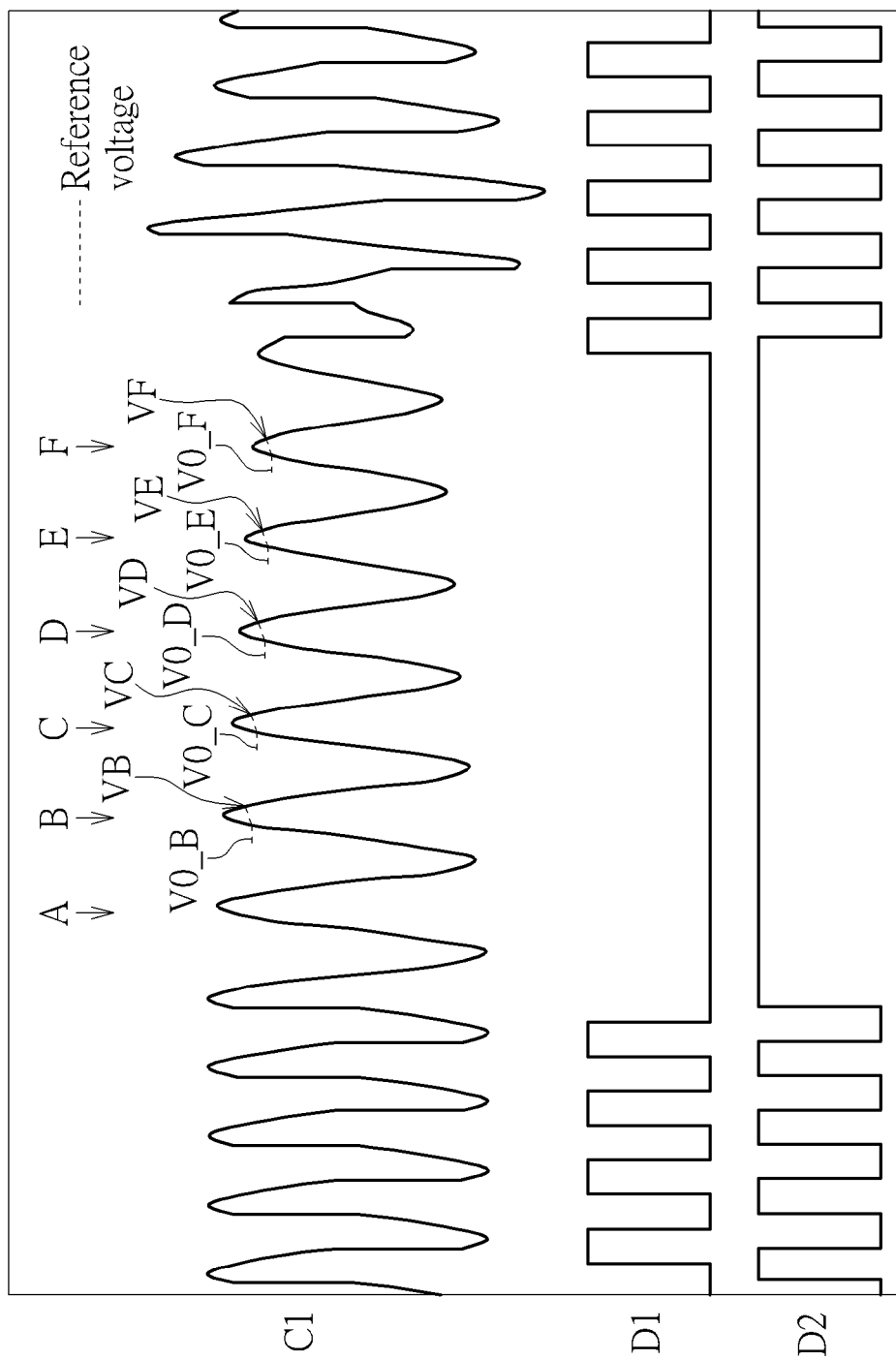

In detail, the processor 111 first compares the first attenuation parameter PAR1 with the first threshold value TH1. After determining that the first attenuation parameter PAR1=124 is smaller than the first threshold value TH1=180, the processor 111 may measure the next oscillation cycle of the coil signal C1 (i.e., the oscillation cycle corresponding to the peak D) to obtain the second attenuation parameter PAR2, and compare the second attenuation parameter PAR2 with the second threshold value TH2. Subsequently, after determining that the second attenuation parameter PAR2=122 is smaller than the second threshold value TH2=170, the processor 111 may measure the next oscillation cycle of the coil signal C1 (i.e., the oscillation cycle corresponding to the peak E) to obtain the third attenuation parameter PAR3, and compare the third attenuation parameter PAR3 with the third threshold value TH3. Subsequently, after determining that the third attenuation parameter PAR3=120 is smaller than the third threshold value TH3=160, the processor 111 may measure the next oscillation cycle of the coil signal C1 (i.e., the oscillation cycle corresponding to the peak F). As shown in FIG. 7, within the oscillation cycle of the peak F, the processor 111 may preset the reference voltage to be equal to a trigger initiation voltage V0_F, and obtain the peak trigger voltage VF corresponding to the peak F according to the above method. The processor 111 then calculates a fourth attenuation parameter PAR4 according to the peak trigger voltage VE and the peak trigger voltage VF. In detail, the processor 111 may calculate the summation result of the peak trigger voltage VE and the peak trigger voltage VF divided by the subtraction result of the peak trigger voltage VE and the peak trigger voltage VF to obtain the fourth attenuation parameter PAR4, and the detailed calculation is shown below:

$$PAR4 = \frac{VE + VF}{VE - VF}$$

In this embodiment, the peak trigger voltage VE is equal to 952 units of voltage and the peak trigger voltage VF is equal to 936 units of voltage. After calculation, the fourth attenuation parameter PAR4 is obtained as 118. Since the number of oscillation cycles measured by the processor 111 in this measurement period reaches a predetermined number, the processor 111 may average the first attenuation parameter PAR1, the second attenuation parameter PAR2, the third attenuation parameter PAR3 and the fourth attenuation parameter PAR4 obtained in the measurement period, and compare the above average result with the basic threshold value TH0 to perform determination on the intruding metal 3. In this embodiment, the average value of the first attenuation parameter PAR1, the second attenuation parameter PAR2, the third attenuation parameter PAR3 and the fourth attenuation parameter PAR4 is smaller than the basic threshold value TH0. Therefore, the processor 111 determines that there is an intruding metal 3 existing in the power supply range of the induction type power supply system 100.

In the above embodiment, the measurement period where the driving signals D1 and D2 interrupt only includes 3-6 oscillation cycles to realize the determination of intruding metal 3. In comparison with U.S. application Ser. No. 15/231,795 where 7-15 oscillation cycles of coil are required to accomplish the measurement of four peak voltage levels to determine the variations of attenuation slope, the intruding metal detection method of the present invention may be realized within a shorter period of time, which further shortens the interrupting time of the driving signals D1 and D2. In general, in the situation where no intruding metal 3 exists and the coil signal C1 is not interfered with by noises, the obtained first attenuation parameter PAR1 may always be greater than the basic threshold value TH0. At this moment, only two oscillation cycles need to be measured to accomplish the determination of intruding metal 3, and after the determination is accomplished, the circuits of the power driver units 121 and 122 may be reconnected immediately to resend the driving signals D1 and D2, as shown in FIG. 3. On the other hand, only when an approaching metal or noise interference causes that the attenuation parameter falls, the processor 111 is required to measure more oscillation cycles. In other words, the smaller attenuation parameter means that an intruding metal is more probably to exist, and thus the number of measured oscillation cycles may also be increased. No matter how many oscillation cycles are measured or how many attenuation parameters are obtained finally, the processor 111 may average all of the obtained attenuation parameter(s) and compare the average result with the basic threshold value TH0 to determine whether an intruding metal 3 exists. In general, when driving of the coil is stopped, the coil signal may resonate intrinsically. If no intruding metal exists, the value of the attenuation slope of the coil signal relative to the amplitude of the coil signal possesses a small variation. Since each attenuation parameter is calculated according to the peak trigger voltages of adjacent oscillation cycles using the same method, the values of the attenuation parameters may be quite stable. In the induction type power supply system, signal determination may be influenced by power noises or circuit noises, but most of the power noises and circuit noises may only generate a small variation on the values of the attenuation parameters; hence, the attenuation parameter may always be greater than the above threshold value so that the determination result will not be influenced. On the contrary, when an intruding metal appears, the peak trigger voltage may be attenuated rapidly, and the attenuation parameter may fall rapidly due to the above calculation of dividing the summation result by the subtraction result, so that the detection and determination of the intruding metal may be performed effectively.

During each measurement period, the number of measured oscillation cycles may be determined according to the comparison result of the attenuation parameter(s) and the corresponding threshold value(s), and the average value of all attenuation parameter(s) may be obtained to determine the intruding metal. In general, when any one of the first, second and third attenuation parameters PAR1-PAR3 is greater than the corresponding threshold value, the calculation of the fourth attenuation parameter PAR4 will not be performed. The first, second and third threshold values TH1-TH3 are all greater than the basic threshold value TH0; hence, if the fourth attenuation parameter PAR4 is not calculated, the average of the previous three attenuation parameters PAR1-PAR3 may usually be greater than the basic threshold value TH0, which leads to the determination result that no intruding metal 3 exists. In such a condition, the processor 111 may determine the number of obtained attenuation parameters or the number of measured oscillation cycles. Only when the number of obtained attenuation parameters reaches a predefined value (e.g., four attenuation parameters), the processor 111 calculates the average of the attenuation parameters to perform determination on the intruding metal 3. If the number of obtained attenuation parameters does not reach the predefined value, the processor 111 may directly determine that there is no existing intruding metal 3.

In addition, in order to enhance the accuracy of determination and also prevent the power output function from being turned off due to wrong determination, the processor 111 may configure a counter for intruding metal. If the average of attenuation parameters obtained during a measurement period is smaller than the basic threshold value, the counter may be added by 1. When the counter for intruding metal reaches a specific value within a predetermined period, the processor 111 determines that there is an existing intruding metal 3. Alternatively, the processor 111 may determine that there is an existing intruding metal 3 when the average value of attenuation parameters is determined to be smaller than the basic threshold value in several consecutive measurement periods.

Please note that, in the above embodiment, the processor 111 first sets a reference voltage to be equal to a trigger initiation voltage, controls the reference voltage to rise when a trigger signal appears at the output terminal of the comparator 114, and then obtains the level of the reference voltage at the end of the trigger signal as the peak trigger voltage. In order to let the peak trigger voltage to effectively reflect the voltage level of the corresponding peak, the trigger initiation voltage should be set to a level close to and slightly lower than the peak voltage, to successfully generate a trigger signal and also make the peak trigger voltage more close to the peak voltage level. If the trigger initiation voltage is too high, the trigger initiation voltage may be higher than the peak voltage and may not successfully trigger. If the trigger initiation voltage is too low, the peak trigger voltage may be too low and may not reflect the actual magnitude of the peak voltage even if the trigger may be successful.

In an embodiment, the processor 111 may calculate the trigger initiation voltage(s) applied in the present measurement period according to corresponding previous peak trigger voltage(s) obtained in the previous measurement period. For example, the processor 111 may set a trigger initiation voltage to a value equal to the previous peak trigger voltage minus a predefined voltage value. Taking the oscillation cycle of the peak B as an example, if the peak trigger voltage VB obtained in the previous measurement period is equal to 1000 units of voltage, the trigger initiation voltage V0_B in the present measurement period may be set to be 900 units of voltage (i.e., 1000 minus a predefined voltage value 100). Taking the oscillation cycle of the peak C as an example, if the peak trigger voltage VC obtained in the previous measurement period is equal to 980 units of voltage, the trigger initiation voltage V0_C in the present measurement period may be set to be 880 units of voltage (i.e., 980 minus the predefined voltage value 100). According to the peak trigger voltage in the previous measurement period, the processor 111 may know a possible level of the peak voltage, and thus set the trigger initiation voltage to a slightly lower voltage level. The lower level of the trigger initiation voltage may increase the occurrence probability of trigger signal. Unless the peak voltage falls rapidly, the signal trigger may appear to obtain the determination result of intruding metal under most conditions.

In U.S. application Ser. No. 15/231,795, the method of determining peak voltage levels is performed by determining whether to increase or decrease the reference voltage according to whether there is a trigger in the previous measurement period, and determining that the reference voltage keeps at the peak voltage level when trigger appears sometimes and no trigger appears sometimes during several consecutive measurement periods. Therefore, without any variations on the loading and output power, a certain number of measurement periods are required to let the reference voltage to remain at the peak voltage level. In comparison, according to the method of obtaining peak trigger voltages of the present invention, the trigger initiation voltage is set to a lower voltage level to increase the occurrence probability of trigger signals. In such a situation, the attenuation parameter may be calculated to perform determination on intruding metal immediately as long as a trigger occurs; hence, in the present invention, determination may be rapidly finished without multiple measurement periods for tying the peak voltage level to the coil peak. In addition, the trigger initiation voltages may be continuously adjusted to preferable voltage levels during the determination process. For example, the trigger initiation voltage V0_B in the present measurement period is set to 900 units of voltage and the trigger signal ends when the reference voltage rises to 910 units of voltage, which means that the peak falls such that the peak trigger voltage VB falls to 910 units of voltage. In such a condition, the trigger initiation voltage V0_B in the next measurement period may be set to 810 units of voltage (i.e., 910 minus the predefined voltage value 100) to achieve preferable trigger effect and also increase the probability of successful trigger.

Please note that sometimes the processor 111 may not be able to obtain the corresponding peak trigger voltage in the previous measurement period. For example, during the previous measurement period, the processor 111 calculates the first attenuation parameter PAR1 according to the peak trigger voltage VB and the peak trigger voltage VC, and determines that the first attenuation parameter PAR1 is greater than the first threshold value TH1; hence, it is not necessary to measure subsequent oscillation cycles and to calculate other attenuation parameters. However, in the present measurement period, the processor 111 determines that the first attenuation parameter PAR1 is smaller than the first threshold value TH1 and thus measurement of subsequent oscillation cycle is required. In other words, the trigger initiation voltage V0_D corresponding to the peak D should be determined in the present measurement period, but the oscillation cycle of the peak D is not measured in the previous measurement period such that no peak trigger voltage VD may be considered as a basis to calculate or estimate the present trigger initiation voltage V0_D. In such a condition, the processor 111 may apply another previous peak trigger voltage of the previous oscillation cycle in the present measurement period (i.e., the peak trigger voltage VC corresponding to the peak C) as the basis, and estimate that the peak trigger voltage VD corresponding to the peak D may be lower than the peak trigger voltage VC by a specific level, so as to calculate the trigger initiation voltage V0_D. For example, if the peak trigger voltage VC is equal to 900 units of voltage, the peak trigger voltage VD of the peak D may be estimated to be 870 units of voltage, and thus the trigger initiation voltage V0_D may be set to 770 units of voltage (i.e., 870 minus the predefined voltage value 100). In another embodiment, the peak trigger voltage VD of the peak D may be estimated according to the peak trigger voltages VB and VC in the same measurement period. For example, if the peak trigger voltage VB is 100 units of voltage and the peak trigger voltage VC is 90 units of voltage, the peak trigger voltage VD of the peak D may be estimated to be approximately equal to 80 units of voltage, so as to set the trigger initiation voltage V0_D to 70 units of voltage for detecting the actual peak trigger voltage VD.

In general, if the oscillation cycle corresponding to the peak D in the previous measurement period is not measured, the data of the previous peak trigger voltage corresponding to the peak D may be generated from a measurement result obtained long time ago. However, the power supply process of the induction type power supply system 100 may possess variations on loading and/or output power, which generate significant variations on the peak voltages of the coil signal C1, and these variations may be up to tens or hundreds of times. In such a condition, the peak trigger voltage obtained long time ago may not be a useful reference. Therefore, a more appropriate trigger initiation voltage may be obtained by using the peak trigger voltage of the previous oscillation cycle in the same measurement period as a basis, in order to increase the probability of successful trigger to obtain the attenuation parameter and the determination result of intruding metal.

Please note that, in the abovementioned methods, the trigger signal may not appear to successfully obtain an attenuation parameter in every measurement period. If a trigger signal does not appear and the corresponding peak trigger voltage is not obtained in an oscillation cycle, the processor 111 may discard the calculation and determination result in the measurement period and also decrease the trigger initiation voltage to increase the probability of successful trigger in the next measurement period. In addition, in order to effectively obtain the peak trigger voltage, the processor 111 may measure the resonant frequency of the coil in advance and obtain a region in each resonant cycle where the peak may appear. If there is no trigger appearing in this region, the trigger initiation voltage may be too high; hence, the processor ill decreases the trigger initiation voltage in the next measurement period and retries to generate a trigger signal to obtain the corresponding peak trigger voltage.

As can be seen, the present invention aims at measuring the coil signal during the measurement period where the driving signals are interrupted to obtain the peak trigger voltages corresponding to a plurality of peak values and calculate the attenuation parameter according to the ratio of the average of two adjacent peak trigger voltages relative the difference of the two peak trigger voltages, in order to compare the attenuation parameter with the corresponding threshold value to determine whether it is necessary to obtain more peak trigger voltages of the peaks for follow-up determination, and thereby perform determination on intruding metal. The processor may set the reference voltage to be equal to a trigger initiation voltage and control the reference voltage to rise gradually when a trigger appears, so as to obtain the peak trigger voltage. Those skilled in the art may make modifications and alternations accordingly. For example, in the above embodiments, there are at most 5 oscillation cycles measured to obtain 5 peak trigger voltages and calculate 4 attenuation parameters in a measurement period. In another embodiment, the maximum number of measured oscillation cycles and the maximum number of obtained attenuation parameters may be adjusted according to system requirements, and should not be limited herein. In addition, in the above embodiments, the values of the peak trigger voltages and the trigger initiation voltages are merely examples, and those skilled in the art may set and obtain appropriate voltage values according to system requirements. For example, the voltage generator 113 may be realized with a DAC, and the abovementioned units of voltage may be digital values configured by the processor 111 and converted into corresponding analog voltages and then outputted by the DAC. The peak trigger voltages and the trigger initiation voltages may be configured with different values for different types or resolutions of the DAC. For example, if the voltage generator 113 is a 12-bit DAC, it may receive digital values between 0-4095 and correspondingly generate an output voltage according to the operating voltage range of the coil signal C1 (after passing through the voltage dividing circuit 130). In addition, the peak trigger voltage is a voltage level obtained when the reference voltage rises to the end of the trigger signal from the trigger initiation voltage, and the processor 111 may adjust the rising speed of the reference voltage. For example, the processor 111 may control the reference voltage to rise with a fixed speed and the rising speed is adjust to an optimal value, so that the voltage level at the end of the trigger signal is able to effectively reflect the peak voltage level.

The intruding metal detection method of the present invention may effectively decrease the interrupting time of the driving signals, to reduce the influence of driving interrupt on the power supply function. Therefore, the determination process of intruding metal should be finished within the least possible time. In the above embodiment, only 2 oscillation cycles in minimum are measured to accomplish the determination of intruding metal. In addition to the discarded oscillation cycle of the first peak, the driving signal needs to be interrupted within the period of three oscillation cycles to the least extent. In another embodiment, the interrupting time of the driving signals may further be reduced.

Figure 8:
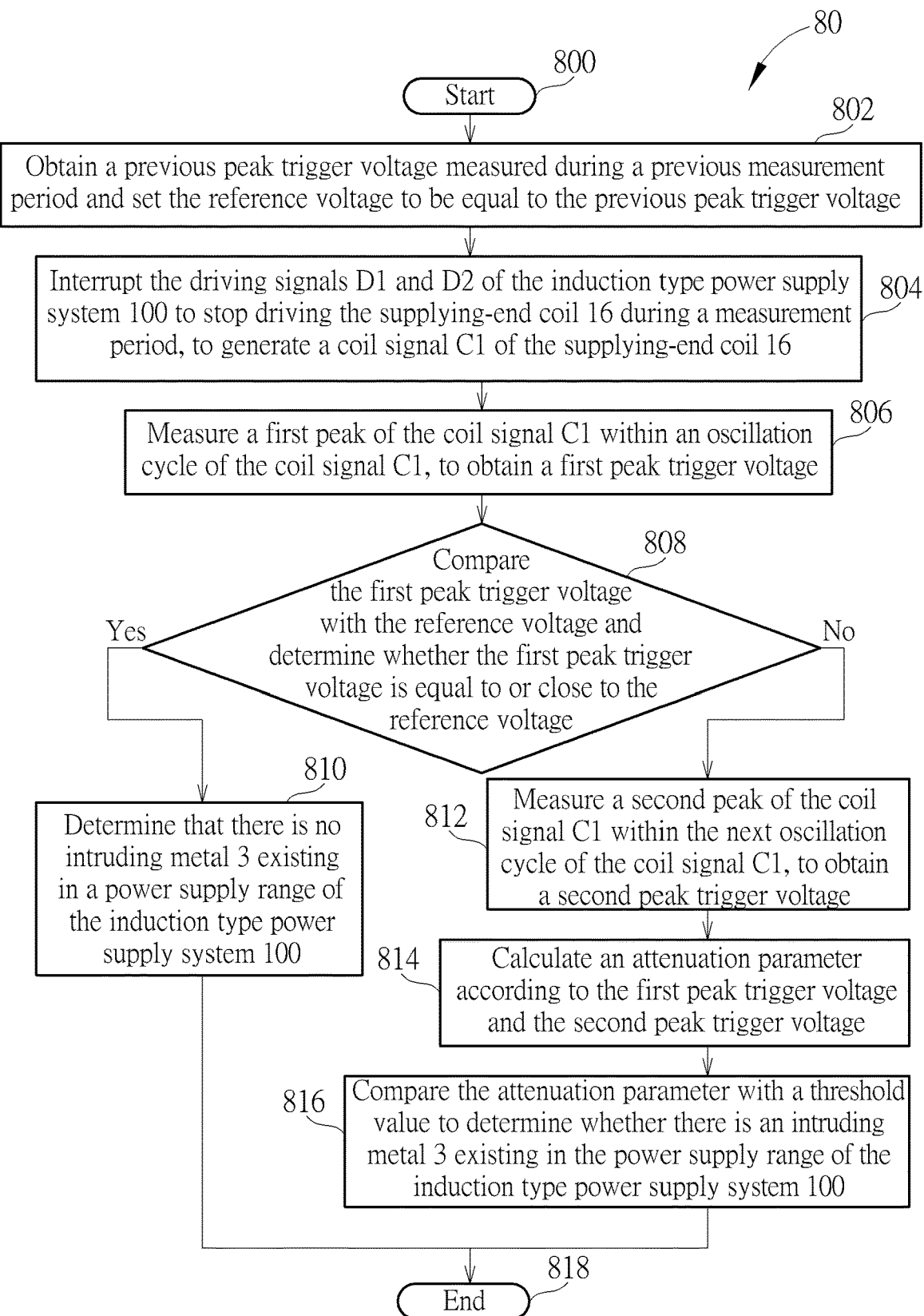
FIG. 8 is a schematic diagram of another intruding metal detection process according to an embodiment of the present invention.

Please refer to FIG. 8, which is a schematic diagram of another intruding metal detection process 80 according to an embodiment of the present invention. As shown in FIG. 8, the intruding metal detection process 80, which may be utilized in a supplying-end device of an induction type power supply system such as the supplying-end module 1 of the induction type power supply system 100 shown in FIG. 1, includes the following steps:

Step 800: Start.

Step 802: Obtain a previous peak trigger voltage measured during a previous measurement period and set the reference voltage to be equal to the previous peak trigger voltage.

Step 804: Interrupt the driving signals D1 and D2 of the induction type power supply system 100 to stop driving the supplying-end coil 16 during a measurement period, to generate a coil signal C1 of the supplying-end coil 16.

Step 806: Measure a first peak of the coil signal C1 within an oscillation cycle of the coil signal C1, to obtain a first peak trigger voltage.

Step 808: Compare the first peak trigger voltage with the reference voltage and determine whether the first peak trigger voltage is equal to or close to the reference voltage. If yes, go to Step 810; otherwise, go to Step 812.

Step 810: Determine that there is no intruding metal 3 existing in a power supply range of the induction type power supply system 100, and then go to Step 818.

Step 812: Measure a second peak of the coil signal C1 within the next oscillation cycle of the coil signal C1, to obtain a second peak trigger voltage.

Step 814: Calculate an attenuation parameter according to the first peak trigger voltage and the second peak trigger voltage.

Step 816: Compare the attenuation parameter with a threshold value to determine whether there is an intruding metal 3 existing in the power supply range of the induction type power supply system 100.

Step 818: End.

The difference between the intruding metal detection process 80 and the intruding metal detection process 20 is that, in the intruding metal detection process 80, the processor 111 only needs to measure one peak of the coil signal C1 and obtain one peak trigger voltage in minimum during the measurement period where the driving signals D1 and D2 are interrupted, to realize the determination of intruding metal 3.

Figure 9:
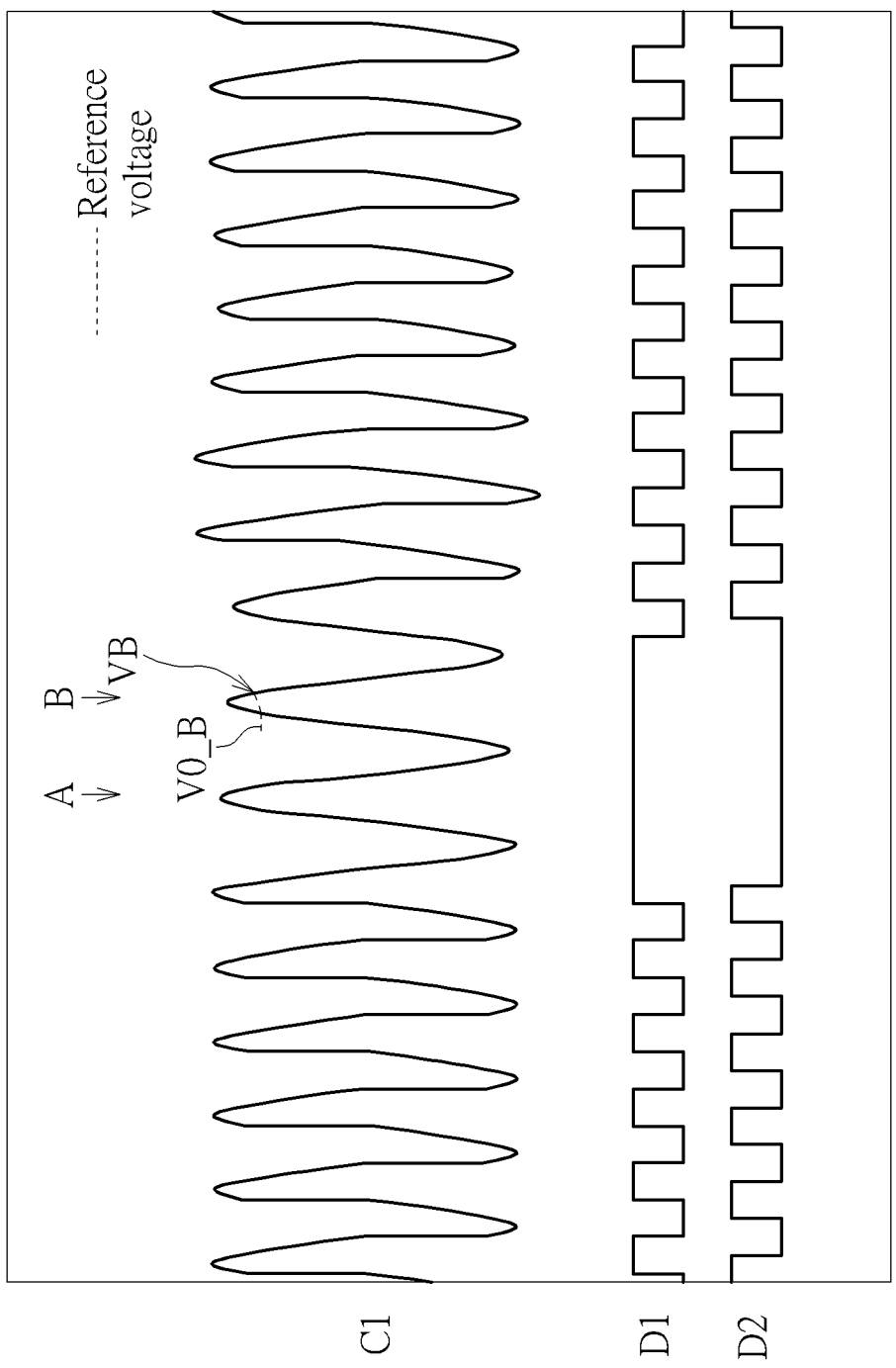
FIG. 9 is a schematic diagram of using a peak trigger voltage to perform determination on the intruding metal during a measurement period according to an embodiment of the present invention.

For example, please refer to FIG. 9, which is a schematic diagram of performing determination on intruding metal using a peak trigger voltage VB during a measurement period according to an embodiment of the present invention. As shown in FIG. 9, the coil signal C1 only includes two peaks A and B in the measurement period. Similarly, in order to prevent that determination of the intruding metal 3 is influenced by the driving signals D1 and D2 and thus gets distorted, the measurement of the peak trigger voltage of the peak A may be omitted. Subsequently, in the oscillation cycle corresponding to the peak B, the processor 111 may set the reference voltage to be equal to a trigger initiation voltage V0_B, and obtain the peak trigger voltage VB corresponding to the peak B according to the above method.

Please note that, in the previous measurement period, the processor 111 may measure a previous peak trigger voltage corresponding to the present peak trigger voltage VB in advance, i.e., the peak trigger voltage VB corresponding to the peak B in the previous measurement period, and store the previous peak trigger voltage VB as a reference voltage. For example, the processor 111 may store the reference voltage in a memory. In addition, in the previous measurement period, only the peak trigger voltage VB is obtained and the determination result indicates that there is no intruding metal 3, or only the peak trigger voltages VB and VC are obtained in the previous measurement period and the calculated first attenuation parameter PAR1 is greater than the first threshold value TH1 to indicate that there is no intruding metal 3. Subsequently, in the present measurement period, the processor 111 only needs to obtain the peak trigger voltage VB corresponding to the peak B and the determination of the intruding metal 3 may be realized. In detail, the processor 111 may compare the peak trigger voltage VB with the reference voltage. When the peak trigger voltage VB is equal to or close to the reference voltage, the processor 111 may determine that there is no intruding metal 3 existing in the power supply range of the induction type power supply system 100. In such a condition, after measurement of the peak trigger voltage VB is complete, the power driver units 121 and 122 may be reconnected to control the driving signals D1 and D2 to drive the supplying-end coil 16 to output power.

In general, when no intruding metal 3 exists and the statuses of the output power of coil and the loading do not change, the peak trigger voltage VB corresponding to the peak B does not change substantially. On the contrary, when an intruding metal 3 enters the power supply range of the induction type power supply system 100, the peak trigger voltage VB may significantly fall due to the intruding metal 3 if other conditions (such as the output power of coil and the loading) remain consistent. In such a condition, the processor 111 only needs to measure the peak trigger voltage VB to accomplish the determination of the intruding metal 3. As a result, during the measurement period where the driving signals D1 and D2 are interrupted, only 2 oscillation cycles are included in minimum, wherein the oscillation cycle corresponding to the peak A is not measured. After measurement of the oscillation cycle corresponding to the peak B is accomplished to obtain the peak trigger voltage VB, the determination of intruding metal 3 may be realized by comparing the peak trigger voltage VB with the reference voltage obtained previously.

In an embodiment, when the peak trigger voltage VB is determined to be equal to or close to the reference voltage, there may be no intruding metal 3 existing in the power supply range of the induction type power supply system 100. At this moment, the processor 111 may update the stored reference voltage and set the reference voltage to be equal to the present peak trigger voltage VB, which is used for the determination in the subsequent measurement period.

Please note that the above determination of "equal to or close to" may be performed in any manner. For example, if the peak trigger voltage VB is within a specific range around the reference voltage, these two voltages are determined to be equal to or close to each other. In an exemplary embodiment, the processor 111 may configure that the region between the level of the reference voltage plus 50 units of voltage and the level of the reference voltage minus 50 units of voltage is considered as close to the reference voltage, and the reference voltage obtained in the previous measurement period is equal to 1000 units of voltage. In such a condition, if the peak trigger voltage VB is within the range of 950-1050 units of voltage, the processor 111 may determine that the peak trigger voltage VB is equal to or close to the reference voltage, and thereby determine that no intruding metal 3 exists. In another embodiment, the range above or below the reference voltage within a specific ratio may be considered as equal to or close to the reference voltage. In an exemplary embodiment, the region between the reference voltage plus five percents and the reference voltage minus five percents is considered as close to the reference voltage, and the reference voltage obtained in the previous measurement period is equal to 500 units of voltage. In such a condition, if the peak trigger voltage VB is within the range of 475-525 units of voltage, the processor 111 may determine that the peak trigger voltage VB is equal to or close to the reference voltage, and thereby determine that no intruding metal 3 exists.

In addition, if the peak trigger voltage VB is determined to be not equal to or close to the reference voltage in the present measurement period, there may be an existing intruding metal 3 or a variation of output power and/or loading in the system. At this moment, the processor 111 should further measure the next oscillation cycle of the coil signal C1 and obtain the corresponding peak trigger voltage. Subsequently, the processor ill may calculate an attenuation parameter according to the peak trigger voltages measured in two adjacent oscillation cycles, and compare the attenuation parameter with the corresponding threshold value to perform determination on the intruding metal 3. In other words, in the intruding metal detection process 80, if a first peak trigger voltage (e.g., VB) is determined to be not equal to or close to the reference voltage, the next oscillation cycle should be measured to obtain a second peak trigger voltage (e.g., VC shown in FIG. 4), to perform subsequent determination of the intruding metal 3, and this determination may be realized with the abovementioned intruding metal detection process 20 shown in FIG. 2.

Please note that, in a special case, the peak trigger voltage VB may be equal to or close to the reference voltage while the intruding metal 3 approaches and the influence is cancelled by movement of the coil or variation of the load. In order to prevent that the intruding metal 3 may not be successively determined in this situation, the processor ill may set an upper limit for the consecutive number of times or the duration period where the peak trigger voltage VB is determined to be equal to or close to the reference voltage. When the consecutive number of times or the duration period reaches the upper limit, the steps of measuring the next oscillation cycle to obtain a second peak trigger voltage (e.g., VC shown in FIG. 4) and calculating the attenuation parameter are performed; that is, to perform determination on the intruding metal 3 using the above intruding metal detection process 20 shown in FIG. 2. In an embodiment, the processor 111 may include a counter, for calculating the consecutive number of times the peak trigger voltage VB is determined to be equal to or close to the reference voltage and thus only the peak trigger voltage VB is measured. The intruding metal detection process 20 shown in FIG. 2 is performed when the counter reaches the upper limit. At this moment, the processor 111 resets the counter to recalculate the consecutive number of times. Alternatively, the processor 111 may include a timer, for determining the duration period where the peak trigger voltage VB is determined to be equal to or close to the reference voltage. The intruding metal detection process 20 shown in FIG. 2 is performed when the timer expires. At this moment, the processor 111 resets the timer to recalculate the duration period. Alternatively, the determination result of the peak trigger voltage VB is not considered in the operations of the timer. For example, the timer may operate periodically based on a specific fixed timing. The intruding metal detection process 80 shown in FIG. 8 is applied in usual, and the intruding metal detection process 20 shown in FIG. 2 is compulsorily performed when the timer expires.

To sum up, the present invention provides an intruding metal detection method which is capable of measuring coil signals to obtain one or more peak trigger voltages during the measurement period where driving signals are interrupted. The processor may compare the peak trigger voltage with a reference voltage obtained previously to perform determination on intruding metal, or calculate the attenuation parameter according to the ratio of the average of two adjacent peak trigger voltages relative to the difference of the two peak trigger voltages. The processor then compares the attenuation parameter with the corresponding threshold value to determine whether to obtain subsequent peak trigger voltages of other peaks for follow-up determination, so as to realize the determination of intruding metal. The processor may set the reference voltage to be equal to a trigger initiation voltage with a lower level, and control the reference voltage to rise gradually when a trigger appears, so as to obtain the peak trigger voltage. Setting the trigger initiation voltage to a lower level may increase the probability of successful trigger to obtain the peak trigger voltage. In addition, when there is no existing intruding metal, the intruding metal detection method of the present invention only needs to measure one or two coil oscillation cycles and correspondingly obtains one or two peak trigger voltages in minimum, to realize the determination of intruding metal. With the additional first peak without measurement, the measurement period where driving signals are interrupted may include 2-3 coil oscillation cycles to the least extent, and the influence on power output function from the interrupted driving signals may be significantly reduced. In addition, the intruding metal detection method of the present invention may perform the determination based on the attenuation ratio of the coil signal, which replaces the determination method of using the attenuation quantity or the attenuation slope in the prior art, so as to solve the problems where the determination based on the attenuation slope is easily influenced by the coil amplitude and loading.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An intruding metal detection method for a supplying-end module of an induction type power supply system, the supplying-end module comprising a supplying-end coil, the intruding metal detection method comprising:
    interrupting at least one driving signal of the induction type power supply system to stop driving the supplying-end coil during a measurement period, to generate a coil signal of the supplying-end coil;
    measuring a plurality of peaks of the coil signal within a plurality of consecutive oscillation cycles of the coil signal, to obtain a plurality of peak trigger voltages, respectively;
    calculating a first attenuation parameter according to a first peak trigger voltage and a second peak trigger voltage among the plurality of peak trigger voltages; and
    comparing the first attenuation parameter with a first threshold value to determine whether there is an intruding metal existing in a power supply range of the induction type power supply system.

2. The intruding metal detection method of claim 1, wherein the step of calculating the first attenuation parameter according to the first peak trigger voltage and the second peak trigger voltage among the plurality of peak trigger voltages comprises:
    calculating the first attenuation parameter according to a ratio of an average of the first peak trigger voltage and the second peak trigger voltage relative to a difference of the first peak trigger voltage and the second peak trigger voltage.

3. The intruding metal detection method of claim 1, wherein the first attenuation parameter is equal to a summation result of the first peak trigger voltage and the second peak trigger voltage divided by a subtraction result of the first peak trigger voltage and the second peak trigger voltage.

4. The intruding metal detection method of claim 1, wherein the first peak trigger voltage is close to and lower than a peak voltage of a corresponding first peak among the plurality of peaks, and the second peak trigger voltage is close to and lower than a peak voltage of a corresponding second peak among the plurality of peaks.

5. The intruding metal detection method of claim 1, wherein the step of measuring the plurality of peaks of the coil signal within the plurality of consecutive oscillation cycles of the coil signal to obtain the plurality of peak trigger voltages, respectively, comprises:
    performing the following steps during one of the plurality of oscillation cycles:
        setting a reference voltage to be equal to a trigger initiation voltage;
        controlling the reference voltage to rise gradually after a trigger signal appears; and
        obtaining a level of the reference voltage at the end of the trigger signal as a peak trigger voltage among the plurality of peak trigger voltages.

6. The intruding metal detection method of claim 5, wherein the step of measuring the plurality of peaks of the coil signal within the plurality of consecutive oscillation cycles of the coil signal to obtain the plurality of peak trigger voltages, respectively, further comprises:
    obtaining a corresponding first previous peak trigger voltage generated during a previous measurement period, and setting the trigger initiation voltage to a value equal to the first previous peak trigger voltage minus a predefined voltage value; or
    performing the following steps when the corresponding first previous peak trigger voltage is not generated during the previous measurement period:
        obtaining a second previous peak trigger voltage within a previous oscillation cycle among the plurality of oscillation cycles;
        calculating a predicted peak trigger voltage according to the second previous peak trigger voltage; and
        setting the trigger initiation voltage to a value equal to the predicted peak trigger voltage minus the predefined voltage value.

7. The intruding metal detection method of claim 1, wherein the step of comparing the first attenuation parameter with the first threshold value to determine whether there is an intruding metal existing in the power supply range of the induction type power supply system comprises:
    determining that there is no intruding metal existing in the power supply range of the induction type power supply system when the first attenuation parameter is greater than the first threshold value; and
    performing the following steps when the first attenuation parameter is smaller than the first threshold value:
        obtaining a third peak trigger voltage among the plurality of peak trigger voltages;
        calculating a second attenuation parameter according to the second peak trigger voltage and the third peak trigger voltage; and
        comparing the second attenuation parameter with a second threshold value.

8. The intruding metal detection method of claim 7, wherein the first threshold value is obtained by adding a first value to a default basic threshold value, and the second threshold value is obtained by adding a second value to the basic threshold value, wherein the second value is smaller than the first value.

9. The intruding metal detection method of claim 1, further comprising:
    calculating a plurality of attenuation parameters according to the plurality of peak trigger voltages; and averaging the plurality of attenuation parameters to determine whether there is an intruding metal existing in the power supply range of the induction type power supply system.

10. The intruding metal detection method of claim 9, wherein the step of averaging the plurality of attenuation parameters to determine whether there is an intruding metal existing in the power supply range of the induction type power supply system comprises:
obtaining an average result generated by averaging the plurality of attenuation parameters;
comparing the average result with a basic threshold value;
determining that there is no intruding metal existing in the power supply range of the induction type power supply system when the average result is greater than the basic threshold value; and
determining that there is an intruding metal existing in the power supply range of the induction type power supply system when the average result is smaller than the basic threshold value.

11. A supplying-end module for an induction type power supply system for performing an intruding metal detection method, the supplying-end module comprising:
a supplying-end coil;
a resonant capacitor, coupled to the supplying-end coil, for performing resonance together with the supplying-end coil;
at least one power driver unit, coupled to the supplying-end coil and the resonant capacitor, for sending at least one driving signal to the supplying-end coil to drive the supplying-end coil to generate energies, and interrupting the at least one driving signal to stop driving the supplying-end coil during a measurement period to generate a coil signal of the supplying-end coil;
a signal receiver, coupled to the supplying-end coil, for receiving the coil signal from the supplying-end coil; and
a processor, coupled to the signal receiver, for performing the following steps:
measuring a plurality of peaks of the coil signal within a plurality of consecutive oscillation cycles of the coil signal, to obtain a plurality of peak trigger voltages, respectively;
calculating a first attenuation parameter according to a first peak trigger voltage and a second peak trigger voltage among the plurality of peak trigger voltages; and
comparing the first attenuation parameter with a first threshold value to determine whether there is an intruding metal existing in a power supply range of the induction type power supply system.

12. The supplying-end module of claim 11, wherein the processor calculates the first attenuation parameter according to a ratio of an average of the first peak trigger voltage and the second peak trigger voltage relative to a difference of the first peak trigger voltage and the second peak trigger voltage.

13. The supplying-end module of claim 11, wherein the first attenuation parameter is equal to a summation result of the first peak trigger voltage and the second peak trigger voltage divided by a subtraction result of the first peak trigger voltage and the second peak trigger voltage.

14. The supplying-end module of claim 11, wherein the first peak trigger voltage is close to and lower than a peak voltage of a corresponding first peak among the plurality of peaks, and the second peak trigger voltage is close to and lower than a peak voltage of a corresponding second peak among the plurality of peaks.

15. The supplying-end module of claim 11, wherein the processor performs the following steps to measure the plurality of peaks of the coil signal within the plurality of consecutive oscillation cycles of the coil signal to obtain the plurality of peak trigger voltages, respectively:
performing the following steps during one of the plurality of oscillation cycles:
setting a reference voltage to be equal to a trigger initiation voltage;
controlling the reference voltage to rise gradually after a trigger signal appears; and
obtaining a level of the reference voltage at the end of the trigger signal as a peak trigger voltage among the plurality of peak trigger voltages.

16. The supplying-end module of claim 15, wherein the processor further performs the following steps to measure the plurality of peaks of the coil signal during the plurality of consecutive oscillation cycles of the coil signal to obtain the plurality of peak trigger voltages, respectively:
obtaining a corresponding first previous peak trigger voltage generated during a previous measurement period, and setting the trigger initiation voltage to a value equal to the first previous peak trigger voltage minus a predefined voltage value; or
performing the following steps when the corresponding first previous peak trigger voltage is not generated during the previous measurement period:
obtaining a second previous peak trigger voltage within a previous oscillation cycle among the plurality of oscillation cycles;
calculating a predicted peak trigger voltage according to the second previous peak trigger voltage; and
setting the trigger initiation voltage to a value equal to the predicted peak trigger voltage minus the predefined voltage value.

17. The supplying-end module of claim 11, wherein the processor performs the following steps to compare the first attenuation parameter with the first threshold value to determine whether there is an intruding metal existing in the power supply range of the induction type power supply system:
determining that there is no intruding metal existing in the power supply range of the induction type power supply system when the first attenuation parameter is greater than the first threshold value; and
performing the following steps when the first attenuation parameter is smaller than the first threshold value:
obtaining a third peak trigger voltage among the plurality of peak trigger voltages;
calculating a second attenuation parameter according to the second peak trigger voltage and the third peak trigger voltage; and
comparing the second attenuation parameter with a second threshold value.

18. The supplying-end module of claim 17, wherein the first threshold value is obtained by adding a first value to a default basic threshold value, and the second threshold value is obtained by adding a second value to the basic threshold value, wherein the second value is smaller than the first value.

19. The supplying-end module of claim 11, wherein the processor further performs the following steps:
calculating a plurality of attenuation parameters according to the plurality of peak trigger voltages; and averaging the plurality of attenuation parameters to determine whether there is an intruding metal existing in the power supply range of the induction type power supply system.

20. The supplying-end module of claim 19, wherein the processor performs the following steps to average the plurality of attenuation parameters to determine whether there is an intruding metal existing in the power supply range of the induction type power supply system:
- obtaining an average result generated by averaging the plurality of attenuation parameters;
- comparing the average result with a basic threshold value;
- determining that there is no intruding metal existing in the power supply range of the induction type power supply system when the average result is greater than the basic threshold value; and
- determining that there is an intruding metal existing in the power supply range of the induction type power supply system when the average result is smaller than the basic threshold value.

* * * * *